(12) United States Patent
Proebsting

(10) Patent No.: US 7,301,850 B1
(45) Date of Patent: *Nov. 27, 2007

(54) CONTENT ADDRESSABLE MEMORY (CAM) DEVICES HAVING BIDIRECTIONAL INTERFACE CIRCUITS THEREIN THAT SUPPORT PASSING WORD LINE AND MATCH SIGNALS ON GLOBAL WORD LINES

(75) Inventor: Robert J. Proebsting, Senora, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 11/393,493

(22) Filed: Mar. 30, 2006

Related U.S. Application Data

(63) Continuation of application No. 10/386,399, filed on Mar. 11, 2003, now Pat. No. 7,092,311.

(60) Provisional application No. 60/364,696, filed on Mar. 15, 2002.

(51) Int. Cl.
*G11C 15/04* (2006.01)

(52) U.S. Cl. ............ 365/230.06; 365/189.07; 365/189.05; 365/49; 365/230.03

(58) Field of Classification Search ......... 365/230.06, 365/230.03, 230.02, 230.08, 189.07, 189.05, 365/49
See application file for complete search history.

(56) References Cited

U.S. PATENT DOCUMENTS

| | | | |
|---|---|---|---|
| 5,446,685 A | 8/1995 | Holst | 365/49 |
| 5,598,115 A | 1/1997 | Holst | 326/119 |
| 5,859,791 A | 1/1999 | Schultz et al. | 365/49 |
| 5,940,852 A * | 8/1999 | Rangasayee et al. | 365/49 |
| 6,058,452 A * | 5/2000 | Rangasayee et al. | 711/108 |
| 6,069,573 A | 5/2000 | Clark, II et al. | 341/50 |
| 6,114,873 A * | 9/2000 | Sahraoui et al. | 326/39 |
| 6,175,514 B1 | 1/2001 | Henderson et al. | 365/49 |
| 6,263,400 B1 * | 7/2001 | Rangasayee et al. | 711/108 |
| 6,307,767 B1 | 10/2001 | Fuh | 365/49 |
| 6,307,855 B1 | 10/2001 | Hariguchi | 370/392 |
| 6,362,992 B1 | 3/2002 | Cheng | 365/49 |
| 6,362,993 B1 | 3/2002 | Henderson et al. | 365/49 |
| 6,470,418 B1 | 10/2002 | Lien et al. | 711/108 |
| 6,505,271 B1 | 1/2003 | Lien et al. | 711/108 |
| 6,539,466 B1 * | 3/2003 | Riedlinger | 711/207 |
| 6,687,785 B1 | 2/2004 | Pereira | 711/108 |
| 6,879,532 B1 * | 4/2005 | Proebsting et al. | 365/203 |
| 7,092,311 B1 * | 8/2006 | Proebsting | 365/230.06 |
| 7,095,641 B1 * | 8/2006 | Proebsting | 365/49 |
| 2003/0005146 A1 | 1/2003 | Miller et al. | 709/238 |

FOREIGN PATENT DOCUMENTS

JP  2001-265654  * 9/2001

* cited by examiner

*Primary Examiner*—Andrew Q. Tran
(74) *Attorney, Agent, or Firm*—Myers Bigel Sibley & Sajovec

(57) ABSTRACT

Content addressable memory devices include a bidirectional interface circuit configured to receive word line signals from a plurality of global word lines and pass match information from a selected one of a plurality of CAM arrays to the plurality of global word lines in response to detecting a match in the selected one of the plurality of CAM arrays.

7 Claims, 14 Drawing Sheets

CONTENT ADDRESSABLE MEMORY (CAM) DEVICES HAVING BIDIRECTIONAL INTERFACE CIRCUITS THEREIN THAT SUPPORT PASSING WORD LINE AND MATCH SIGNALS ON GLOBAL WORD LINES

REFERENCE TO PRIORITY APPLICATION

This application claims priority to U.S. application Ser. No. 10/386,399, filed Mar. 11, 2003 now U.S. Pat. No. 7,092,311, which claims priority to U.S. Provisional Application Ser. No. 60/364,696, filed Mar. 15, 2002, the disclosures of which are hereby incorporated herein by reference.

FIELD OF THE INVENTION

The present invention relates to integrated circuit devices and, more particularly, to integrated circuit memory devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216 and 6,128,207 to Lien et al., the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}.

Applications using CAM devices include database management, disk caching, pattern and image recognition and artificial intelligence. CAM devices are also well suited for use in routing network traffic, such as in network address lookup or packet switching. A network switch comprising a CAM device having entries therein arranged in sectors is illustrated as FIG. 1 of U.S. application Ser. No. 09/962,737, entitled "Content Addressable Memory (CAM) Devices That Can Identify Highest Priority Matches in Non-Sectored CAM Arrays and Methods of Operating Same, filed Sep. 25, 2001, the disclosure of which is hereby incorporated herein by reference. Each of the illustrated sectors is organized to contain only entries having the same number of actively masked bits, with the number of masked bits identifying entries of same priority.

FIG. 1 herein illustrates a conventional CAM device having a plurality of CAM arrays therein arranged in a plurality of rows and columns. The CAM arrays in the first, second, third and fourth rows are illustrated as $CAM_{00}$-$CAM_{07}$, $CAM_{10}$-$CAM_{17}$, $CAM_{20}$-$CAM_{27}$ and $CAM_{30}$-$CAM_{37}$. A respective row priority encoder is also provided between each pair of CAM arrays. Thus, as illustrated, the CAM device of FIG. 1 includes sixteen (16) row priority encoders (shown as Row Priority $Encoder_{00}$-Row Priority $Encoder_{33}$). These row priority encoders perform final encoding of all match information generated by a respective pair of CAM arrays. A respective global word line decoder is also provided for each row of CAM arrays. As will be understood by those skilled in the art, each global word line decoder provides word line signals on global word lines to the CAM arrays of a respective row during reading and writing operations. Unfortunately, the CAM device of FIG. 1 may not achieve sufficiently high integration or sufficiently low power consumption because each of the row priority encoders typically consumes substantial chip area and requires substantial duplication of circuitry. Moreover, the pitch between global word lines that span across each row of CAM arrays may not be sufficiently large to achieve high yield and reliability when CAM arrays having many rows of normal and redundant CAM cells are utilized.

U.S. Pat. No. 6,307,767 to Fuh also discloses a CAM device having a plurality of CAM arrays therein that are electrically coupled to a central priority encoder. In particular, FIG. 3 of the '767 patent illustrates a prior art CAM device having a central priority encoder 120 that receives match control signals from multiple CAM arrays 101-116 during a lookup operation and then, in response, generates an output address of a highest priority matching entry. FIG. 4 of the '767 patent discloses a CAM system having a plurality of CAM arrays therein that are assigned different priority levels. Circuitry is provided for identifying which of the plurality of CAM arrays has one or more matching entries of highest priority and then latching match control signals from the identified CAM array. These latched signals are provided to a respective priority encoder, which generates a respective address of a highest priority matching entry in the identified CAM array.

SUMMARY OF THE INVENTION

Integrated circuit memory devices according to first embodiments of the present invention may include a plurality of content addressable memory (CAM) arrays therein and circuitry that efficiently communicates match information from the plurality of CAM arrays to a priority encoder. According to these first embodiments, an integrated circuit CAM device is provided having a priority encoder therein and a first tier of CAM arrays arranged side-by-side relative to each other, on a first side of the priority encoder. A priority class detector is also provided for efficiently communicating the match information that is generated during a search operation. The priority class detector passes match information from a selected priority class of rows in a selected one of the CAM arrays in the first tier to the priority encoder. This operation to pass match information is performed in response to detecting a match in the selected priority class when a search operation is performed. According to an aspect of these first embodiments, the priority class detector performs operations to locally encode match lines associated with a respective CAM array by priority class. These match lines are associated with a plurality of consecutive rows or consecutive pairs of rows that are arranged in a repeating priority class sequence comprising different priority classes. The priority class sequence may be an alternating priority class sequence, with each physically even row (or even pair of rows) in a CAM array being associated with one priority class and each physically odd row (or odd pair of rows) in a CAM array being associated within another priority class. Alternative priority class sequences may also be provided.

According to still additional aspects of these first embodiments, a preferred CAM device may also include a global word line decoder that is electrically coupled to the priority class detector by a plurality of global word lines. The priority encoder may also be electrically coupled to the plurality of global word lines and the priority class detector may pass match information to the priority encoder via the plurality of global word lines. In this manner, the plurality of global word lines may constitute global word/match lines. The global word line decoder and the priority class detector may provide the word line information and match information as active low signals, for example.

Integrated circuit memory devices according to second embodiments of the present invention may a include content addressable memory (CAM) array having data entries therein that are arranged by priority class. According to these embodiments, a plurality of consecutive data entries or a plurality of consecutive pairs of data entries in the CAM array are arranged in a repeating priority class sequence comprising different priority classes. The sequence may include two or more different priority classes. For example, every one of a first priority class of data entries may be provided in a respective plurality of physically even rows within the CAM array and every one of a second priority class of data entries may be provided in a respective plurality of physically odd rows, with the first priority class being higher or lower than the second priority class. The sequence may also be established so that each physically even pair of adjacent rows within the CAM array is of one priority class and each physically odd pair of adjacent rows within the CAM array is of another priority class. Alternatively, the sequence may be established so that every third, fourth, . . . , etc. row in the CAM array is associated with a respective priority class.

Integrated circuit memory devices according to third embodiments of the present invention may include a tier of CAM arrays having a width greater than two and a global priority encoder that is electrically coupled to the tier of CAM arrays. This global priority encoder provides final encoding of all match information generated by all CAM arrays in the tier. According to additional aspects of these embodiments, a global word line decoder is provided along with a plurality of global word lines. The plurality of global word lines are electrically coupled to the global word line decoder and the global priority encoder. A bidirectional interface circuit is also preferably provided. This bidirectional interface circuit receives global word line signals from the plurality of global word lines and decodes these global word line signals as local word lines signals. The bidirectional interface circuit also passes match information from a selected CAM array in the tier to the plurality of global word lines in response to detecting a match in the selected CAM array. The bidirectional interface circuit preferably includes a priority class detector and a local word line decoder.

Embodiments of the present invention also include methods of operating integrated circuit memory devices. One preferred method includes performing a search operation between data applied to a CAM array and data entries therein to thereby detect a plurality of matching data entries of different priority classes. The matching data entries in a highest priority class containing at least one matching entry are then selectively identified. The identified matching entries in the highest priority class are then encoded so that an address of a highest priority match within the highest priority class can be generated.

DESCRIPTION OF PREFERRED EMBODIMENTS

Figure 1:
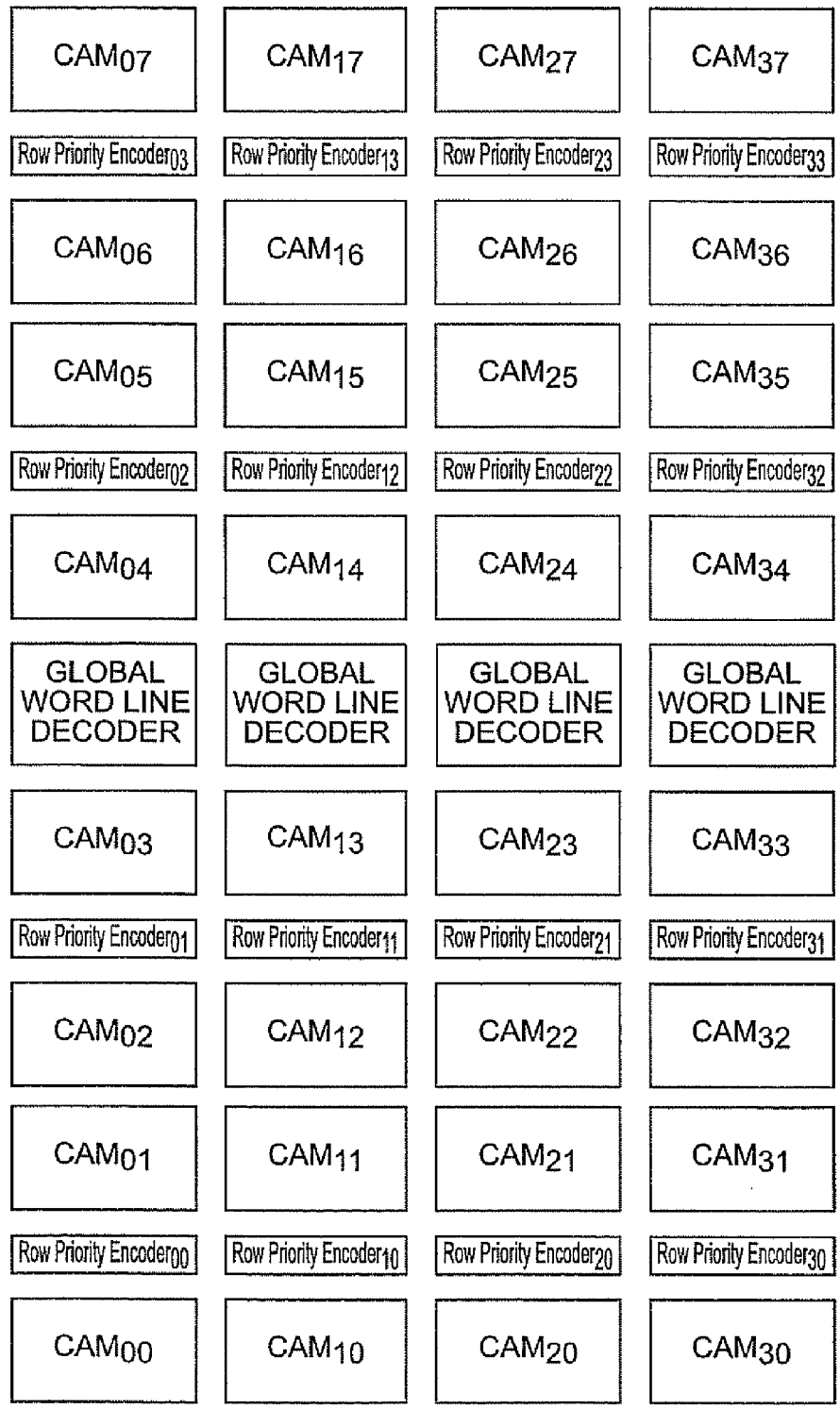
FIG. 1 is a block diagram of a content addressable memory (CAM) device having a plurality of CAM arrays therein, according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Figure 2A:
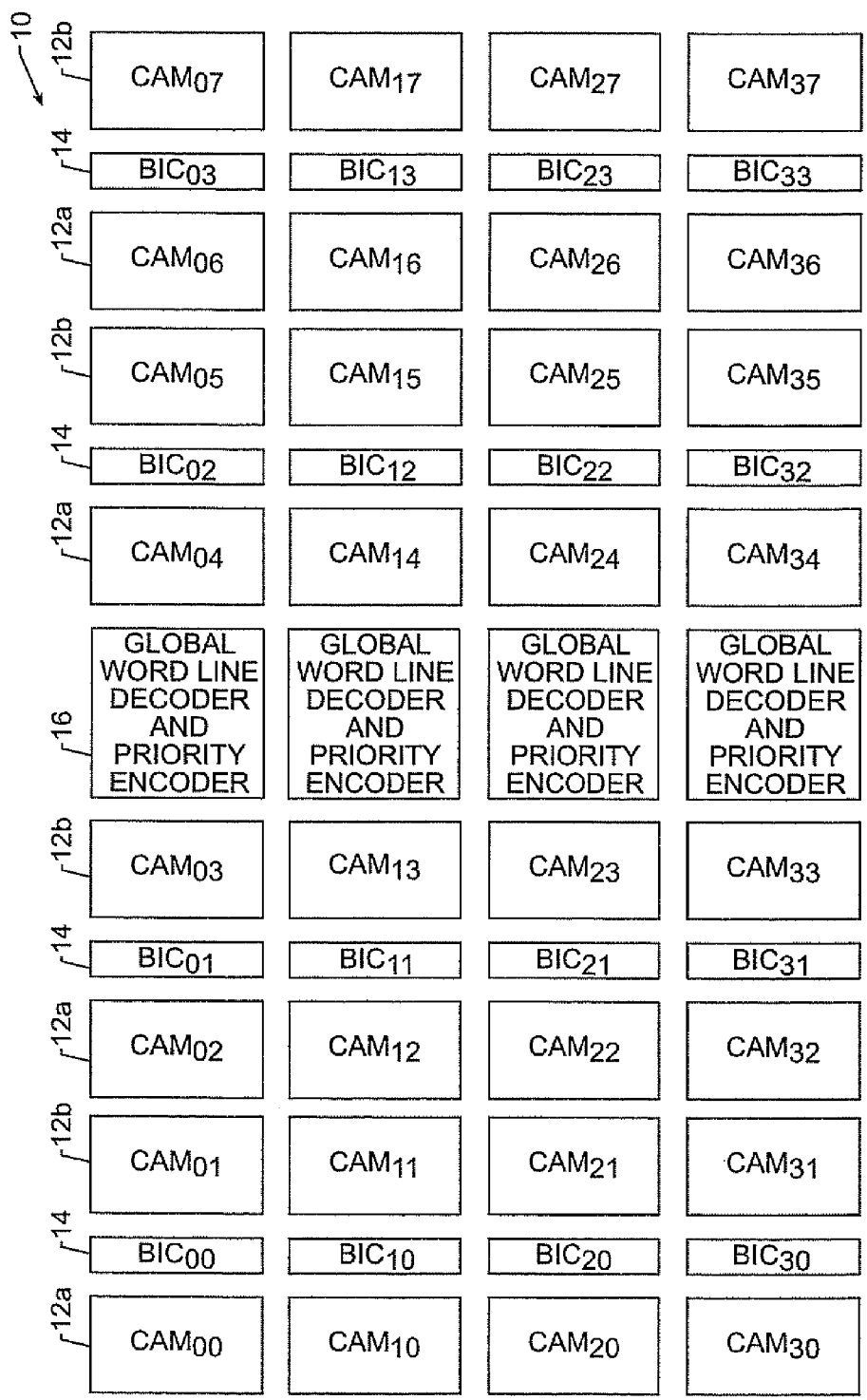
FIG. 2A is a block diagram of a content addressable memory (CAM) device according to an embodiment of the present invention.

Content addressable memory (CAM) devices according to embodiments of the present invention may include multiple CAM arrays therein. As illustrated by FIG. 2A, preferred CAM devices 10 according to first embodiments of the present invention may include a plurality of CAM arrays that are arranged by row and column, with each row of CAM arrays including a left side tier of CAM array pairs and a right side tier of CAM array pairs that are arranged on opposing sides of a respective control circuit 16. A separate control circuit 16 may be provided for each row of CAM arrays, as illustrated. Each control circuit 16 may include, among other things, a global word line decoder and a priority encoder. The global word line decoder and priority encoder may be of conventional design. Each CAM array pair may be arranged as a left side CAM array 12a and a right side CAM array 12b.

For purposes of illustration only, the left side tier of CAM arrays in the first row (row 0) includes four columns of CAM arrays numbered as $CAM_{00}$-$CAM_{03}$. The right side tier of CAM arrays in the first row also includes four columns of CAM arrays numbered as $CAM_{04}$-$CAM_{07}$. In the second, third and fourth rows, the CAM arrays on the left side and right side tiers are numbered as $CAM_{10}$-$CAM_{13}$, $CAM_{14}$-$CAM_{17}$, $CAM_{20}$-$CAM_{23}$, $CAM_{24}$-$CAM_{27}$, $CAM_{30}$-$CAM_{33}$ and $CAM_{34}$-$CAM_{37}$. Thus, the illustrated CAM device 10 includes 32 CAM arrays that are arranged into 16 pairs. CAM devices 10 having high capacity typically include a larger number of CAM arrays. For example, a CAM device 10 having 18 Meg capacity may include 512 CAM arrays arranged as eight (8) left side tiers and eight (8) right side tiers, with each tier containing 32 CAM arrays (i.e., 16 CAM array pairs). These 512 CAM arrays may have 512 normal rows each (72 bits wide plus any redundant columns) and 8 redundant rows each (72 bits wide plus any redundant columns).

Figure 2B:
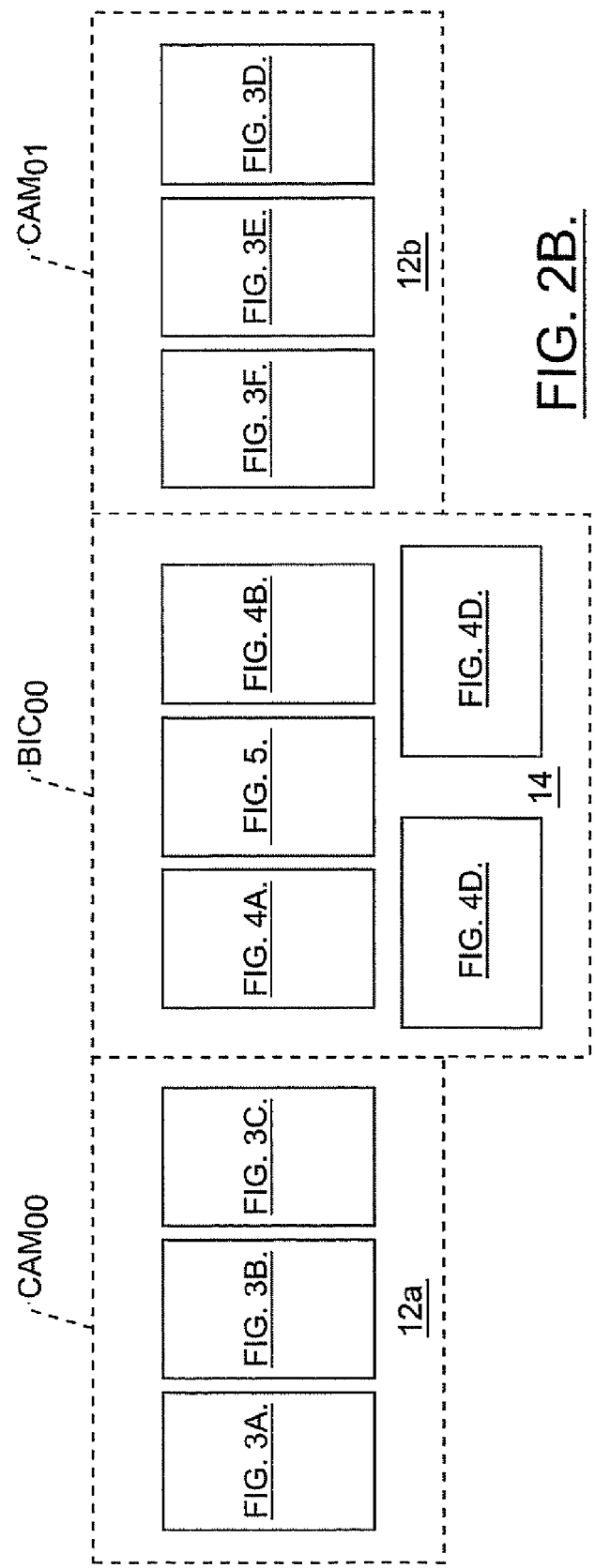
FIG. 2B is a block diagram illustrating the relative placement of the circuit elements of FIGS. 3A-3F, 4A-4B, 4D and 5, in the CAM array pair ($CAM_{00}$-$CAM_{01}$) and respective bidirectional interface circuit ($BIC_{00}$) illustrated in FIG. 2A.

According to a preferred aspect of the illustrated CAM device 10, a respective bidirectional interface circuit 14 is provided between a left side CAM array 12a and a right side CAM array 12b in each CAM array pair. These bidirectional interface circuits 14 are numbered as $BIC_{00}$-$BIC_{03}$, $BIC_{10}$-$BIC_{13}$, $BIC_{20}$-$BIC_{23}$, $BIC_{30}$-$BIC_{33}$ in the first, second, third and fourth rows, respectively. The word "bidirectional" is used to emphasize that each interface circuit communicates data in two directions, with the first direction extending from a selected CAM array in a pair to the control circuit 16 and the second direction extending from the control circuit 16 to a selected CAM array. As described more fully hereinbelow with respect to FIGS. 3A-3F, 4A-4D and 5-6, each of these bidirectional interface circuits 14 may be electrically coupled locally to the CAM arrays 12a and 12b in a respective pair and also globally to a respective control circuit 16 within the same row. This global electrical coupling may be provided by, among other things, global word lines. A block diagram illustrating the relative placement of the circuit elements of FIGS. 3A-3F, 4A-4B, 4D and 5, in a CAM array pair ($CAM_{00}$-$CAM_{01}$) is provided by FIG. 2B. All the elements of FIG. 2B (except those included in FIG. 4D) correspond to four adjacent rows of two CAM arrays 12a, 12b and their respective bidirectional interface circuit 14 in FIG. 2A.

Figure 3A:
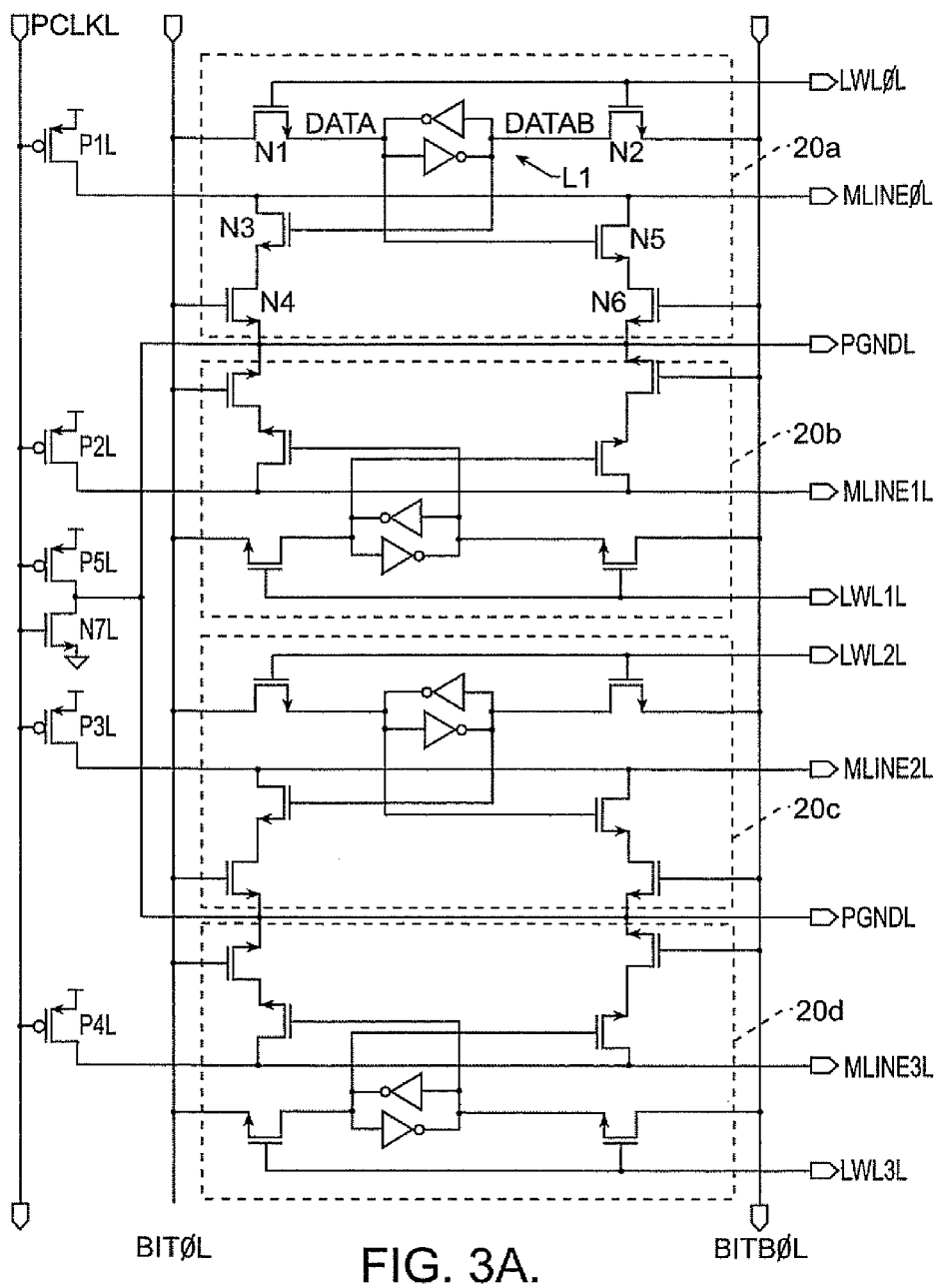
FIGS. 3A-3C are electrical schematics that illustrate a configuration of a left side CAM array according to an aspect of the CAM device of FIG. 2A.
Figure 3B:
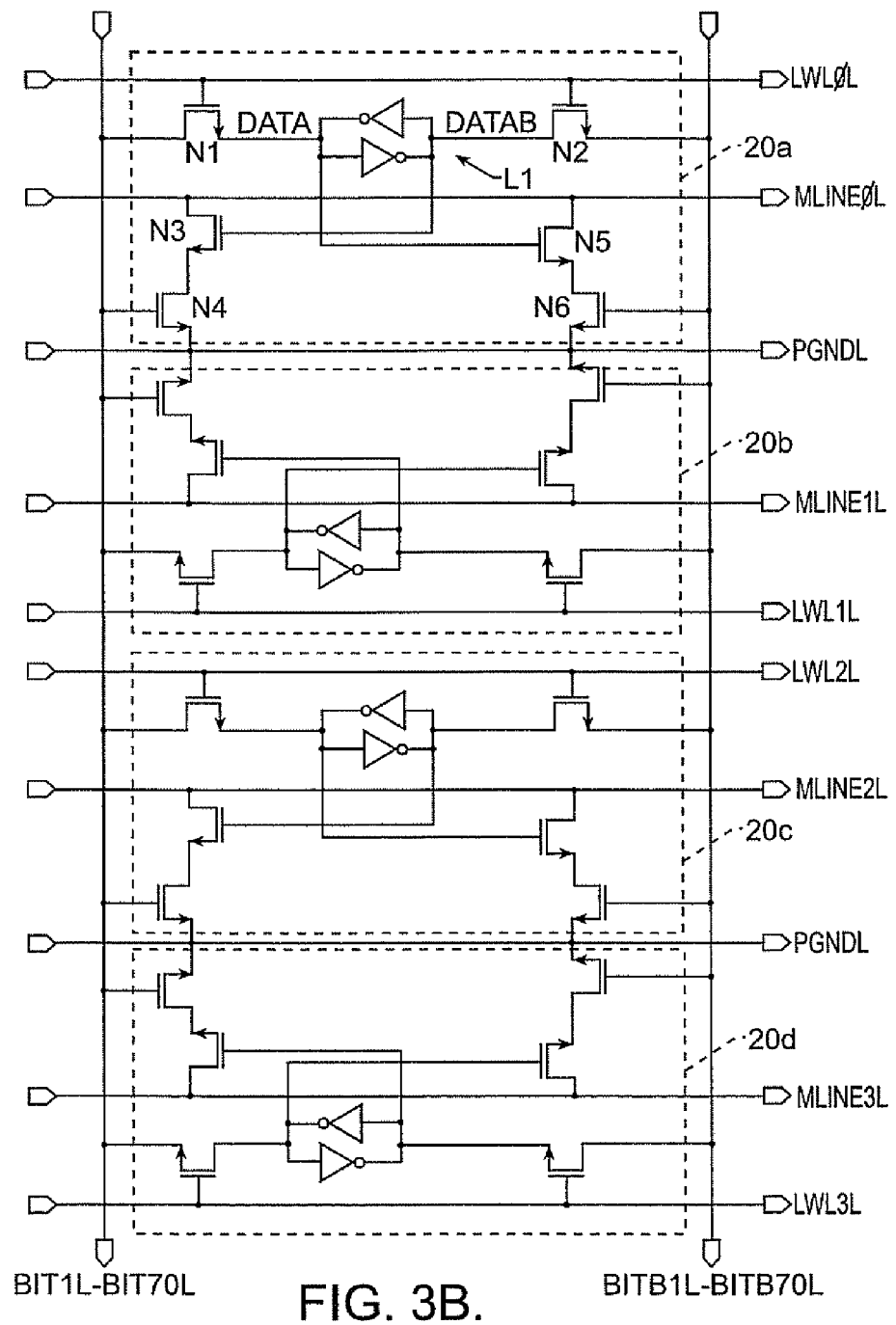
Figure 3C:
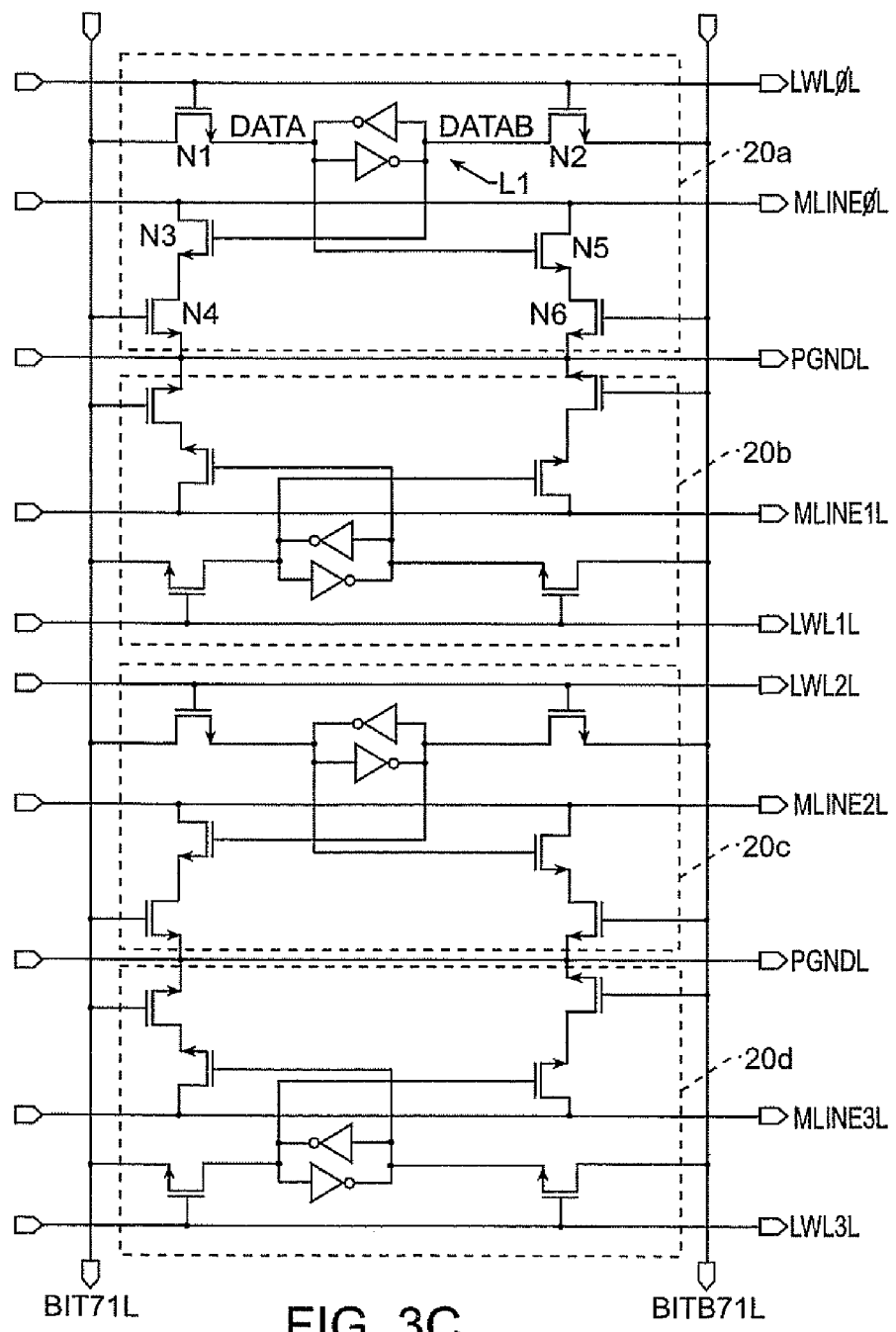

Referring to FIGS. 3A-3C, a preferred arrangement of a left side CAM array 12a will now be described in greater detail. It will be understood by those skilled in the art, however, that CAM arrays of different or conventional design may be substituted for the illustrated left side CAM array 12a. Referring now to FIG. 3A, the left side CAM array 12a may include a leftmost column of CAM cells that are electrically coupled to a respective leftmost pair of differential bit lines, shown as bit lines BIT0L and BITB0L in column 0. Although not shown, each of the differential bit lines may be connected to a respective CMOS driver. The CMOS drivers may be provided with tri-state outputs. The leftmost column and each other column of CAM cells in the left side CAM array 12a may include a plurality of normal rows of CAM cells and one or more redundant rows of CAM cells. The redundant rows of CAM cells may be interspersed between the normal rows or provided as the lowermost or uppermost rows of the respective CAM array, for example. For purposes of discussion herein, the left side CAM array 12a will be treated as including 512 normal rows, with each row being 72 bits wide (BIT0-BIT71). The discussion herein also applies equally to redundant rows in a CAM array.

FIG. 3A also illustrates four CAM cells 20a-20d arranged in consecutive order in rows 0-3 in the first column. First and second CAM cells 20a and 20b are illustrated as being mirror images of each other relative to a common pseudo-ground line PGNDL. Third and fourth CAM cells 20c and 20d are also illustrated as being mirror images of each other relative to a common pseudo-ground line.

Each of the CAM cells 20a-20d is illustrated as including first and second NMOS read/write access transistors N1 and N2, a latch L1 and compare circuitry. The latch L1 retains complementary bit data (DATA, DATAB) and is illustrated as including a pair of inverters that are connected in anti-parallel. The compare circuitry is illustrated as comprising NMOS transistors N3-N6. The gates of NMOS access transistors N1 and N2 are connected to a respective local word line, shown as LWL0L-LWL3L. The drain terminals of NMOS transistors N3 and N5 within the compare circuitry are connected to a respective match line, shown as MLINE0L-MLINE3L. The source terminals of NMOS transistors N4 and N6 are typically connected to a respective pseudo-ground line. However, according to a preferred aspect of the illustrated embodiment, the source terminals of NMOS transistors N4 and N6 in a group of four consecutive rows of CAM cells are electrically connected to a single pseudo-ground line, shown as PGNDL. Each group of four consecutive rows of CAM cells will be referred to herein as a "quad" group. The CAM cells 20a-20d are illustrated as binary CAM cells, but may also comprise ternary CAM cells that retain data and mask information.

The operation of compare circuitry within a CAM cell will now be described. For purposes of discussion herein, a "high" signal level will be treated as a logic 1 signal level and a "low" signal level will be treated as a logic 0 signal level. As will be understood by those skilled in the art, if the illustrated first CAM cell 20a in FIG. 3A is storing a logic 1 data bit (i.e., DATA=1, DATAB=0) and the differential bit lines BIT0L and BITB0L in a first pair are pulled high to a logic 1 level and low to a logic 0 level, respectively, to thereby represent application of a logic 1 bit of an applied search word during a search operation, then NMOS transistors N3 and N6 will be off and NMOS transistors N4 and N5 will be on. Based on this scenario of applied and stored data, neither the first serial electrical path provided by NMOS transistors N3 and N4 nor the second serial electrical path provided by NMOS transistors N5 and N6 will be conductive. Accordingly, the first CAM cell 20a will not operate to electrically "short" the first match line MLINE0L and pseudo-ground line PGNDL together. However, if the illustrated first CAM cell 20a in FIG. 3A is storing a logic 0 data bit (i.e., DATA=0, DATAB=1) and the differential bit lines BIT0L and BITB0L are pulled high to a logic 1 level and low to a logic 0 level, respectively, during a search operation, then NMOS transistors N3 and N4 will be on and NMOS transistors N5 and N6 will be off. Based on this scenario of applied and stored data, the first serial electrical path provided by NMOS transistors N3 and N4 will operate to electrically "short" the first match line MLINE0L and pseudo-ground line PGNDL together. In this manner, the presence of a mismatch between the data stored within the first CAM cell 20a and the search bit applied to the first pair of differential bit lines BIT0L and BITB0L, referred to herein as a "miss," will manifest itself as an electrical "short" in the first CAM cell 20a. This electrical short electrically connects the first match line MLINE0L to the pseudo-ground line PGNDL. In contrast, the presence of a "match" between the data stored within the first CAM cell 20a and the search bit applied to the first pair of differential bit lines BIT0L and BITB0L will manifest itself as an electrical "open" within the first CAM cell 20a.

FIGS. 3B and 3C complete the illustration of the first four consecutive rows of CAM cells within a left side CAM array 12a, with FIG. 3B illustrating the quad group of rows 0-3 in columns 1-70 and FIG. 3C illustrating the quad group of rows 0-3 in the last column 71. Based on the illustrated arrangement of CAM cells within the left side CAM array 12a, a search of the contents of the left side CAM array 12a, described herein as containing 512 data entries of 72 bit width, can be commenced after all of the match lines MLINE0L-MLINE511L and pseudo-ground lines PGNDL within each quad group are precharged to logic 1 levels and the new search data (i.e., a new search word) is applied to the differential bit lines ((BIT0L, BITB0L)-(BIT71L, BITB71L)).

As illustrated by the PMOS pull-up transistors P0L-P3L and P5L and NMOS pull-down transistor N7L on the left side of FIG. 3A, the match lines MLINE0L-MLINE3L and pseudo-ground line PGNDL associated with the first quad group of rows can be precharged high in response to a leading edge (e.g., falling edge) of an active low pulse on precharge clock signal line PCLKL. The match lines and pseudo-ground lines associated with the other quad groups of rows (not shown) can be pulled high in a similar fashion in-sync with the precharge clock signal PCLKL. A search of the contents of the left side CAM array 12a may then continue with the triggering of a compare operation in-sync with the next following trailing edge (e.g., rising edge) of the precharge clock signal PCLKL. This trailing edge causes the pseudo-ground lines PGNDL within the left side CAM array 12a to be pulled low by the NMOS pull-down transistor N7L. If all (unmasked) bits of one or more entries within the left side CAM array 12a match the applied search word, the match lines associated with the rows containing the matching entries will remain high at their precharged high levels, while all other match lines will be pulled low to the potential of the pseudo-ground lines PGNDL. The match lines MLINE0L-MLINE511L and pseudo-ground lines PGNDL described herein may also be divided into respective match line segments or pseudo-ground line segments to enable a search operation to be performed in a segmented manner across groups of columns. For example, a CAM array having 72 columns of CAM cells therein may be searched by performing a ×18 bit search and ×54 bit search in sequence during a single search cycle.

Figure 3D:
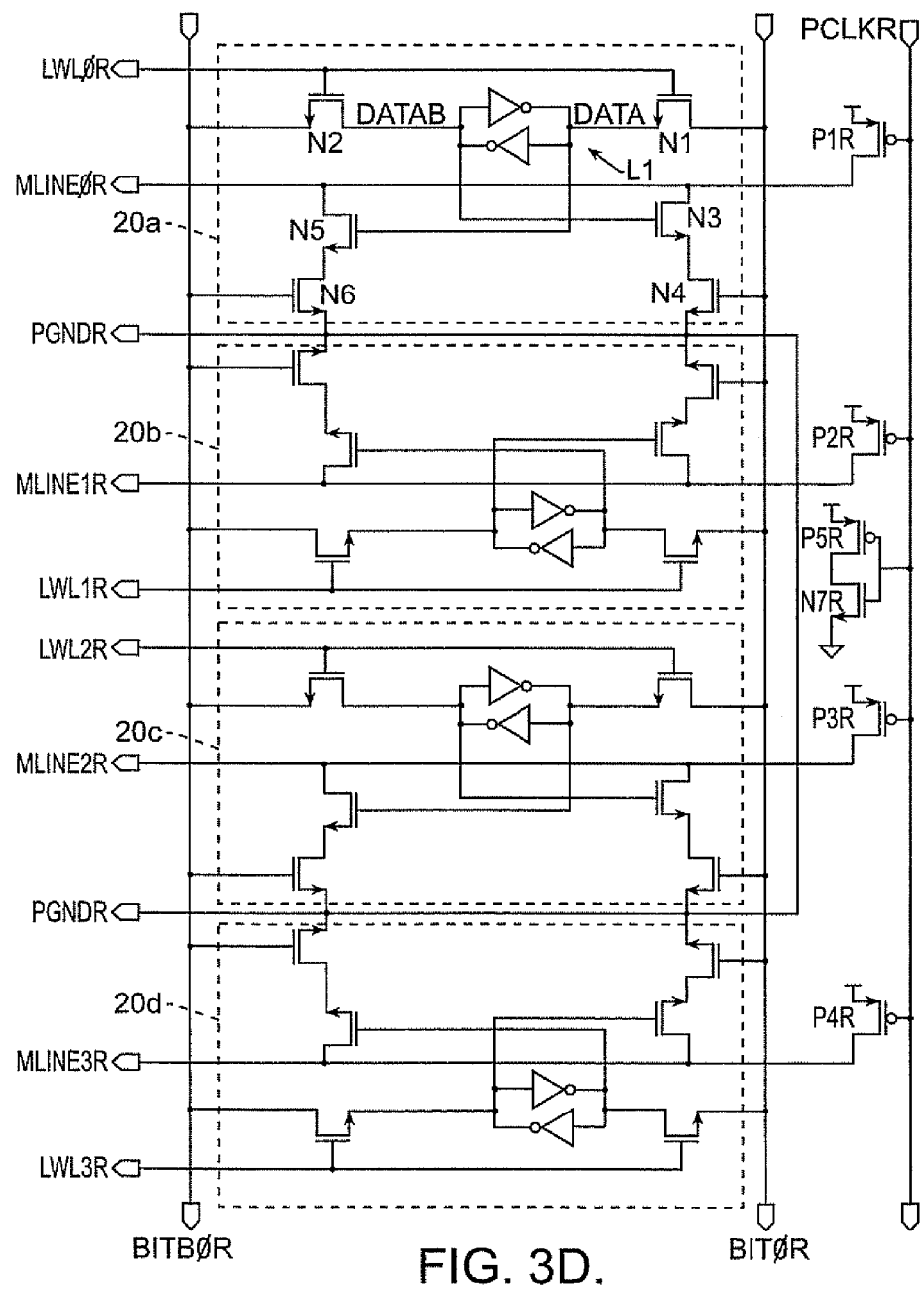
FIGS. 3D-3F are electrical schematics that illustrate a configuration of a right side CAM array according to an aspect of the CAM device of FIG. 2A.
Figure 3E:
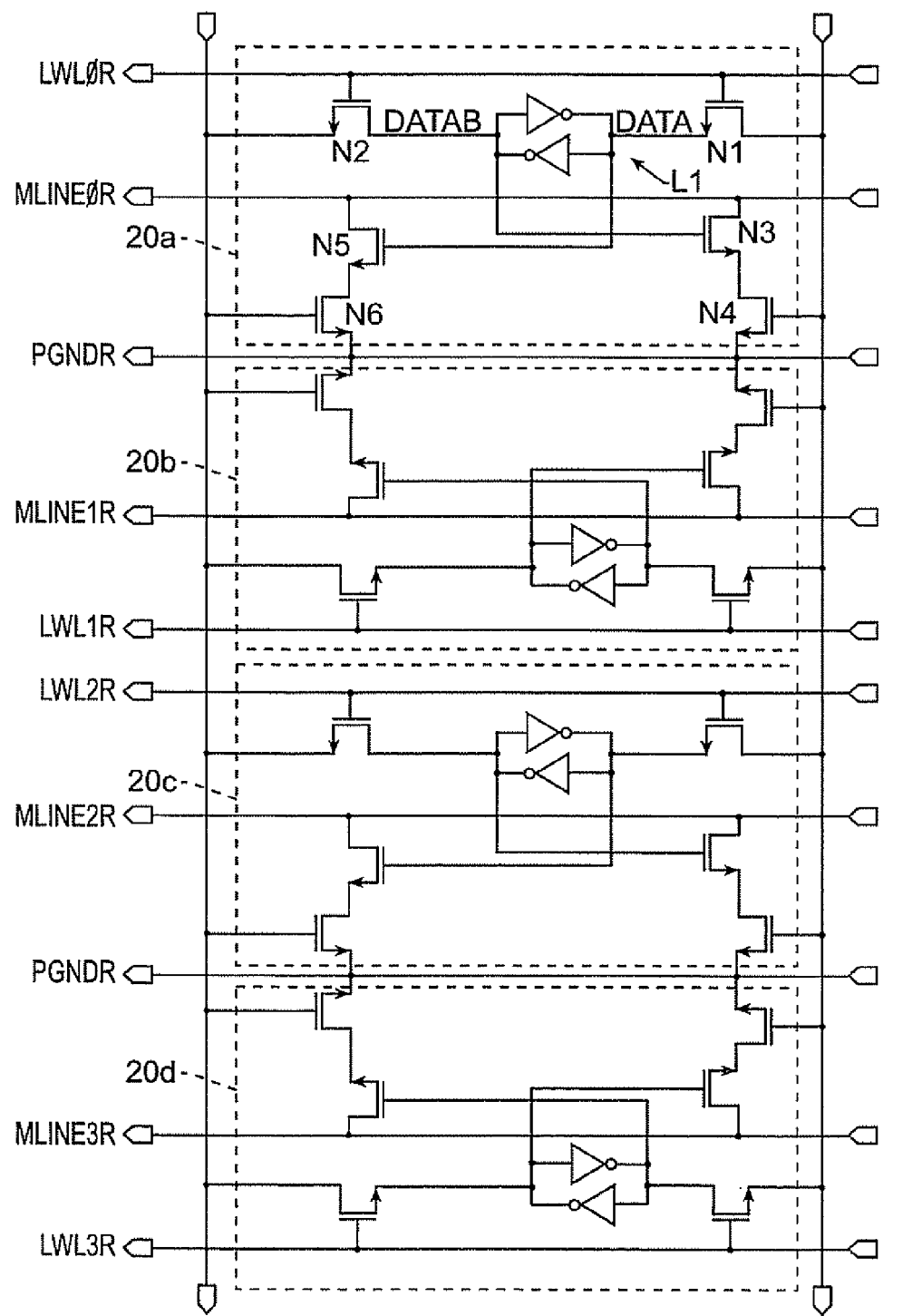
Figure 3F:
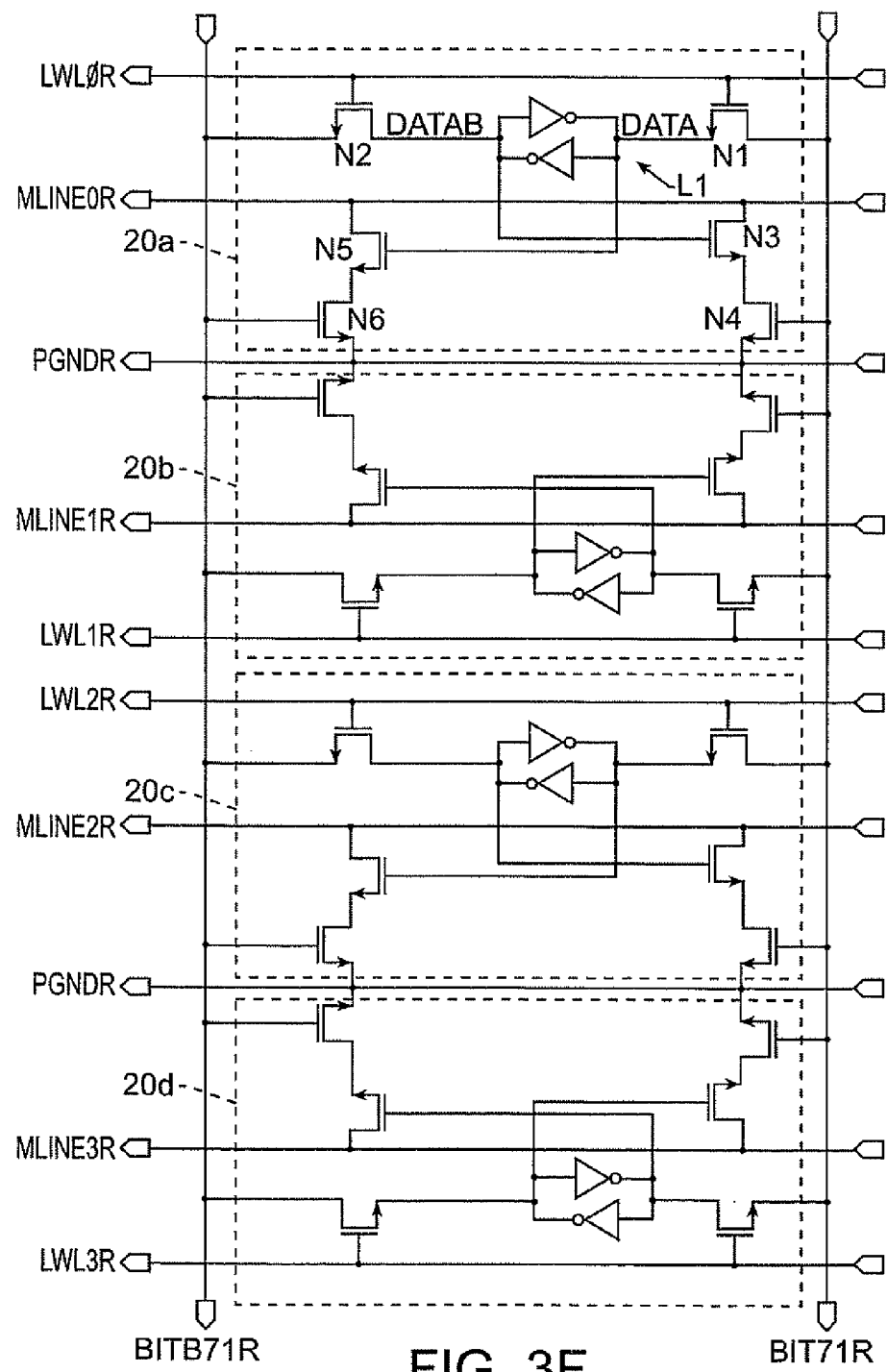

A preferred arrangement of a right side CAM array 12b is illustrated by FIGS. 3D-3F. This preferred arrangement of the right side CAM array 12b is a left-to-right mirror image of the left side CAM array 12a of FIGS. 3A-3C, with the reference character "L" replaced by "R." Because of the essentially identical arrangements and operation of the right and left side CAM arrays, FIGS. 3D-3F need not be described further herein. The relative placement of the columns of CAM cells in a CAM array pair is more fully illustrated by FIG. 2B.

As described above with respect to FIG. 2A, each left side CAM array 12a and right side CAM array 12b in a respective CAM array pair is preferably separated by a respective bidirectional interface circuit 14. As described more fully hereinbelow, each bidirectional interface circuit 14 may include a priority class detector and a local word line decoder in the preferred embodiment. The priority class detector is illustrated by FIGS. 4A-4D and 5 and the local word line decoder is illustrated by FIG. 5.

Figure 4A:
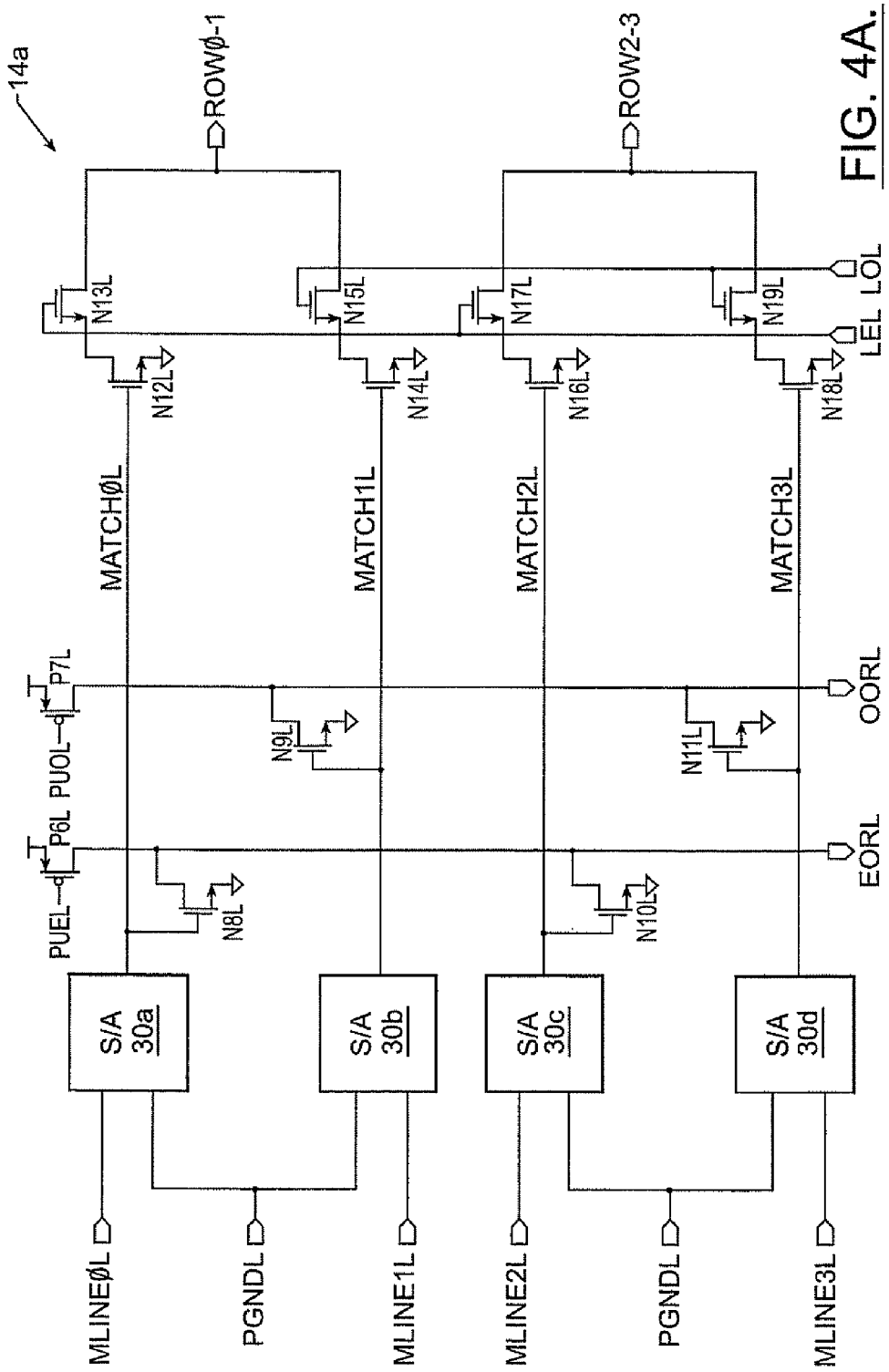
FIGS. 4A-4D and 5 are electrical schematics that illustrate a configuration of a bidirectional interface circuit according to an aspect of the CAM device of FIG. 2A.
Figure 4B:
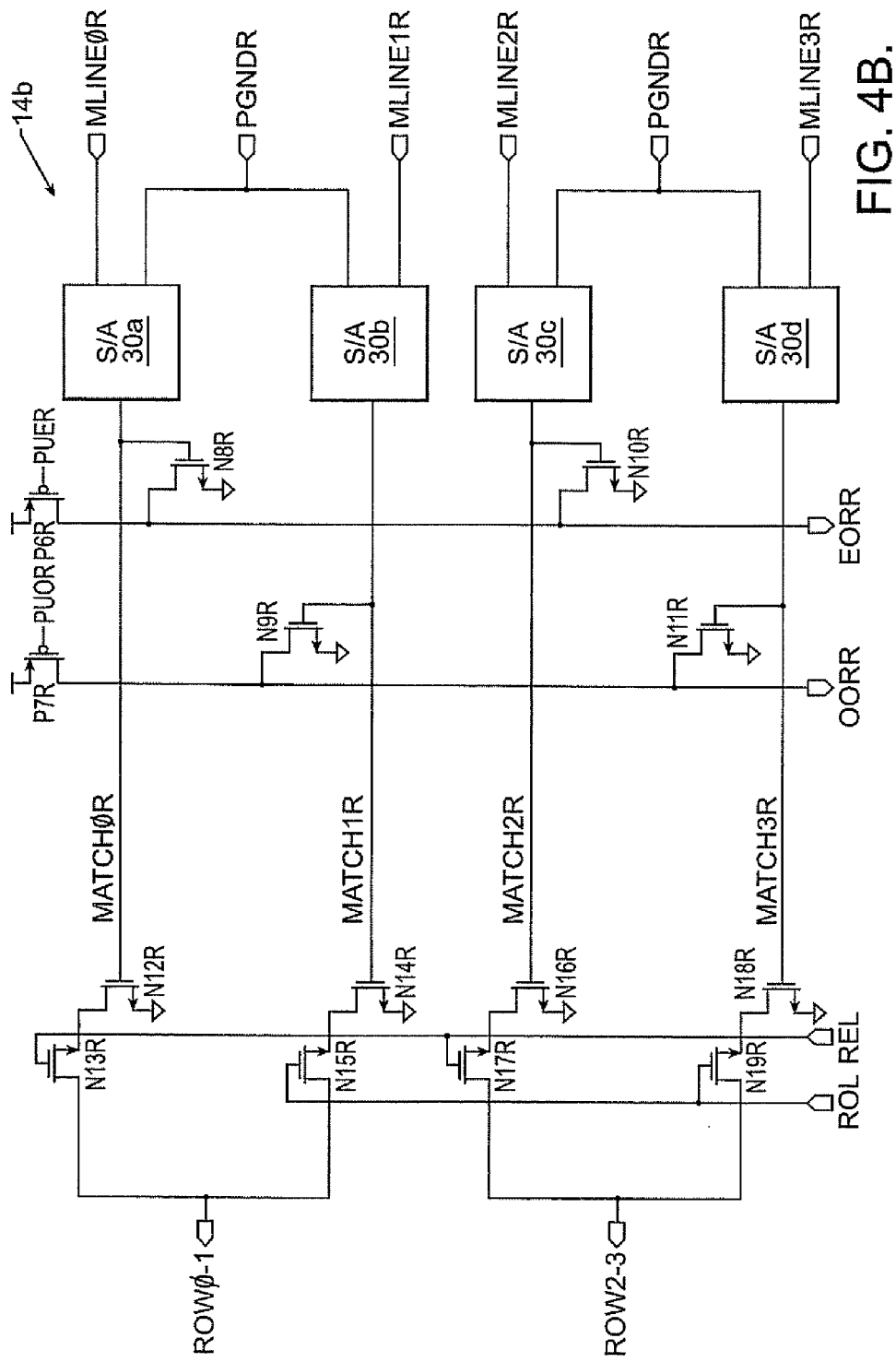
Figure 5:
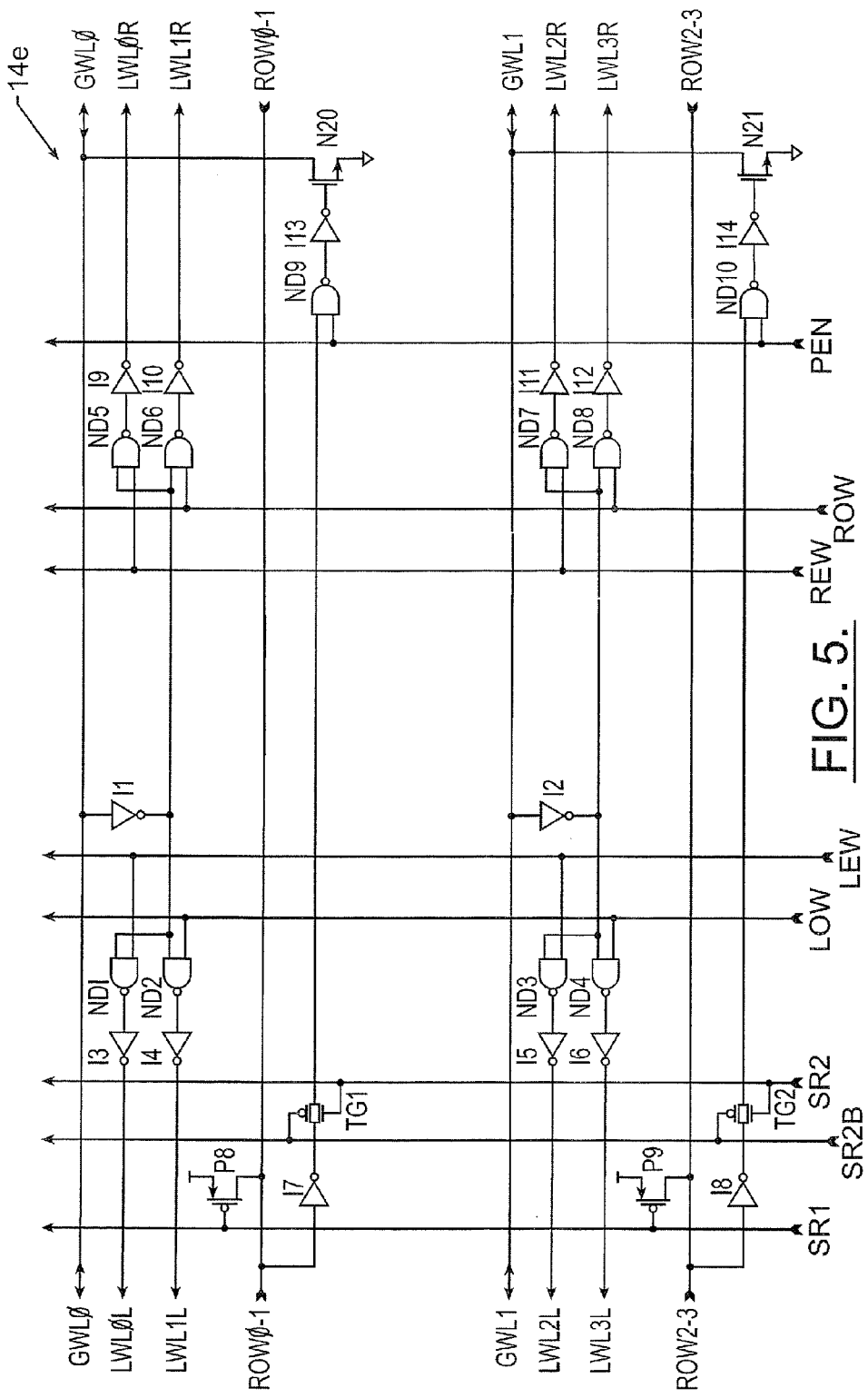
Figure 6:
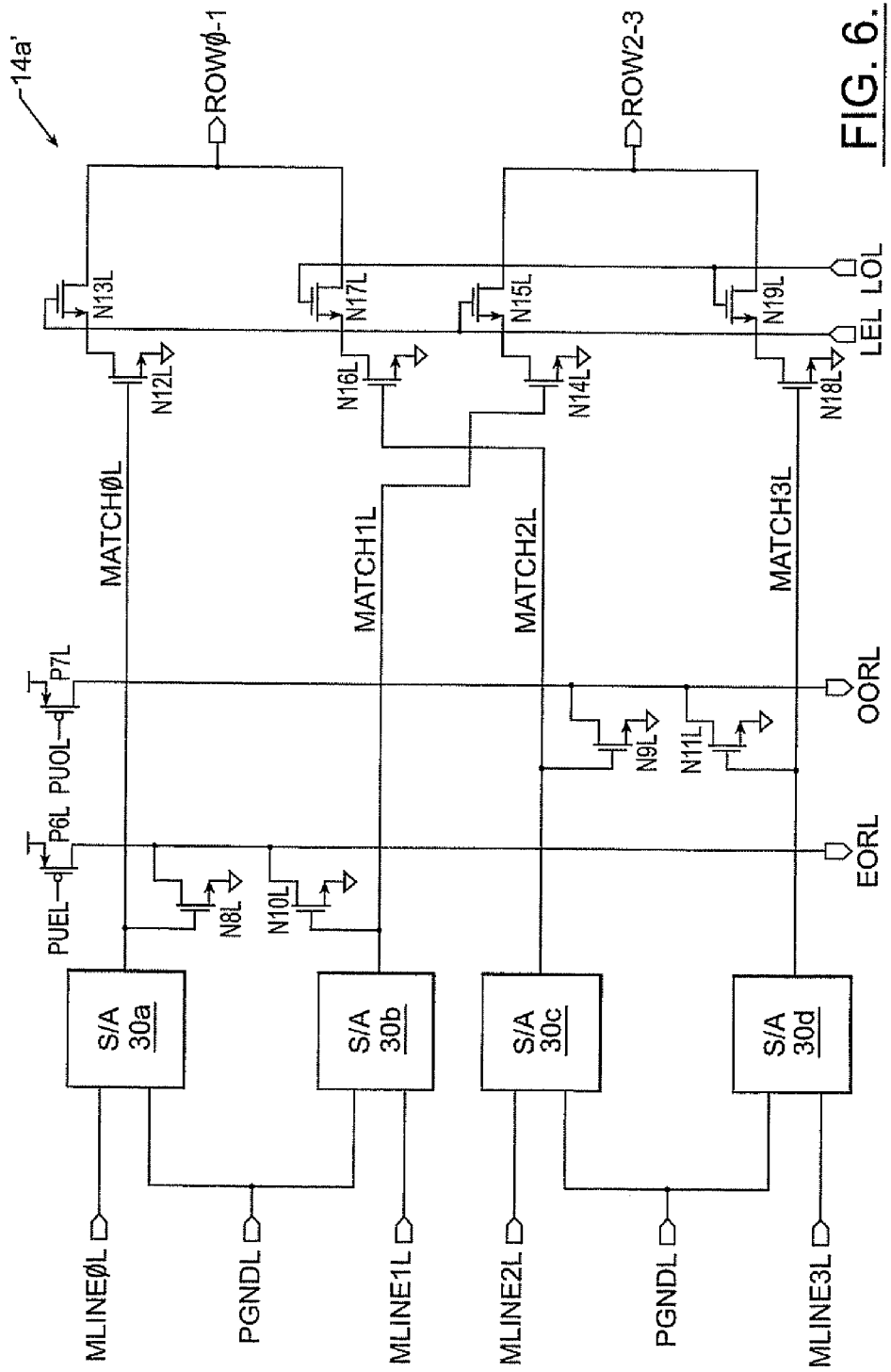
FIG. 6 is an electrical schematic of an alternative input stage of a priority class detector that can be substituted for the input stage of FIG. 4A.

Referring now to FIG. 4A, a portion of a left input stage 14a of the bidirectional interface circuit 14 is electrically coupled to the rightmost ends of the match lines MLINE0L-MLINE3L and the pseudo-ground lines PGNDL associated with the first quad group of rows of the left side CAM array 12a. Respective additional portions of the left input stage 14a are electrically coupled to the rightmost ends of the match lines and pseudo-ground lines associated with the remaining normal quad groups of rows (and any redundant quad groups of rows). These additional portions of the left input stage 14a may be identical to the illustrated portion, but have not been illustrated for purposes of clarity and ease of understanding. In a similar manner, a portion of a right input stage 14b of the bidirectional interface circuit 14 is electrically coupled to the leftmost ends of the match lines MLINE0R-MLINE3R and the pseudo-ground lines PGNDR associated with the first quad group of rows of the right side CAM array 12b. This portion of the right input stage 14b is illustrated by FIG. 4B.

The illustrated portion of the left input stage 14a preferably includes a plurality of sense amplifiers 30a-30d that can be enabled during a compare operation to detect whether any of the match lines MLINE0L-MLINE3L associated with the first quad group of rows within the left side CAM array 12a are indicating the presence of a matching entry (i.e., all (enabled) CAM cells have identical data to their respective bit of the word being searched). As described above, if the first row of CAM cells in the left side CAM array 12a contains a matching entry, then the first match line MLINE0L will remain at a precharged high level at the end of the compare operation because none of the CAM cells in the first row will provide an electrical short between the first match line MLINE0L and the pseudo-ground line PGNDL, which was pulled low at the commencement of the compare operation. If the first row of CAM cells in the left side CAM array 12a does not contain a matching entry (i.e., a miss has occurred), then the first match line MLINE0L will be pulled low. The same conditions apply to the other match lines as well. Each of the sense amplifiers 30a-30d may be configured to drive a respective match condition line MATCH0L-MATCH3L low between search cycles. This low condition will remain if a miss has occurred but will switch to a high condition if a match is present. The sense amplifiers 30a-30d may be configured using conventional circuitry. However, as more fully described in U.S. Provisional Application Ser. No. 60/371,419, filed Apr. 10, 2002, these sense amplifiers 30a-30d are preferably dynamic sense amplifiers having reduced power consumption requirements. The disclosure of U.S. Provisional Application Ser. No. 60/371,419 is hereby incorporated herein by reference.

Figure 4C:
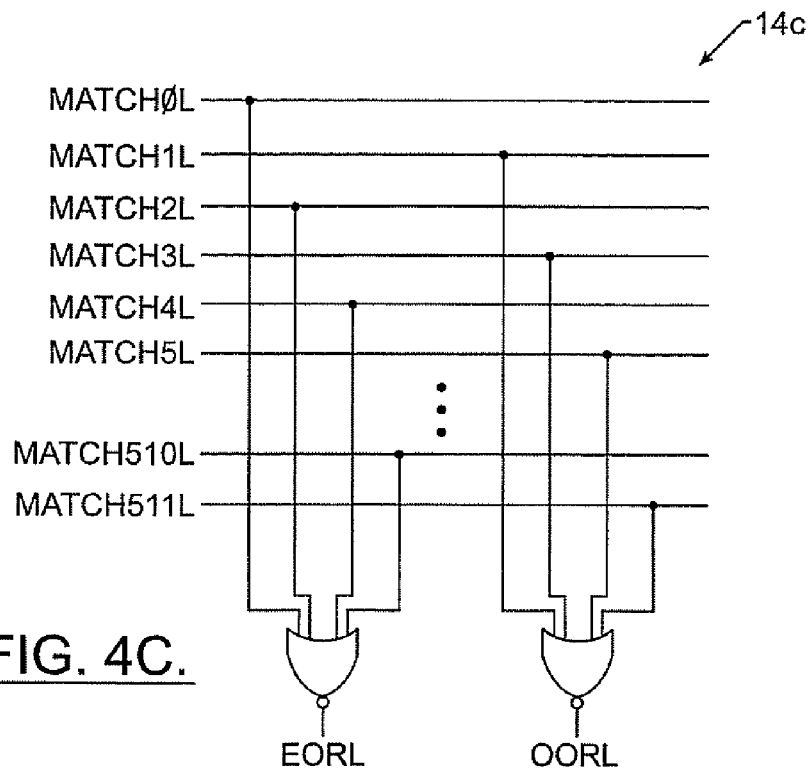

As illustrated by FIGS. 4A and 4C, each of the even match condition lines MATCH0L, MATCH2L, MATCH4L, . . . , MATCH510L associated with physically even rows (i.e., rows 0, 2, 4, . . . , 510) within the left side CAM array 12a are provided as inputs to a dynamic NOR gate having an output coupled to signal line EORL ("Even OR Left"). This signal line EORL is precharged high by one or more PMOS pull-up transistors P6L that may be located above or below respective rows or groups of rows. A gate of the PMOS pull-up transistor P6L is responsive to an active low control signal POL (Precharge OR Left). The active low control signal POL may be received by PMOS pull-up transistor P6L while the match lines and pseudo-ground lines are being precharged high. The NOR gate associated with signal line EORL may include 256 NMOS pull-down transistors, with even match condition line MATCH0L driving a gate of NMOS transistor N8L and even match condition line MATCH2L driving a gate of NMOS transistor N10L, and so on for the remaining even match condition lines MATCH4L, MATCH6L, . . . , MATCH510L.

As also illustrated by FIGS. 4A and 4C, each of the odd match condition lines MATCH1L, MATCH3L, MATCH5L, . . . , MATCH511L associated with physically odd rows (i.e., rows 1, 3, 5, . . . , 511) within the left side CAM array 12a are provided as inputs to a NOR gate having an output coupled to signal line OORL ("Odd OR Left"). This signal line OORL is precharged high by one or more PMOS pull-up transistors P7L. A gate of the PMOS pull-up transistor P7L may be responsive to the active low control signal POL. The dynamic NOR gate associated with signal line OORL may include 256 NMOS pull-down transistors, with odd match condition line MATCH1L driving a gate of NMOS transistor N9L and odd match condition line MATCH3L driving a gate of NMOS transistor N11L, and so on for the remaining odd match condition lines MATCH5L, MATCH7L, . . . , MATCH511L.

Accordingly, based on the illustrated portion of the left input stage 14a of FIG. 4A, the detection of a matching entry in any even row of the left side CAM array 12a will cause the signal line EORL to be pulled low from a precharged high level. Similarly, the detection of a matching entry in any odd row of the left side CAM array 12a will cause the signal line OORL to be pulled low from a precharged high level. However, the transition of signal line EORL from high-to-low does not in and of itself indicate how many matching entries are present in the even rows of the left side CAM array 12a. Instead, the high-to-low transition simply indicates that one or more even matching entries are present. Similarly, the transition of signal line OORL from high-to-low does not in and of itself indicate how many matching entries are present in the odd rows of the left side CAM array 12a.

The preferred arrangement of the right input stage 14b of FIG. 4B is a left-to-right mirror image of the left input stage 14a of FIG. 4A, with the reference character "L" replaced by "R". Thus, the detection of a matching entry in any even row of the right side CAM array 12b will cause the signal line EORR to be pulled low from a precharged high level. Similarly, the detection of a matching entry in any odd row of the right side CAM array 12b will cause the signal line OORR to be pulled low from a precharged high level. The transition of signal line EORR from high-to-low does not indicate how many matching entries are present in the even rows of the right side CAM array 12b. Instead, the high-to-low transition of signal line EORR simply indicates that one or more matching even entries are present in the right side CAM array 12b. Similarly, the transition of signal line OORL from high-to-low does not indicate how many matching entries are present in odd rows of the right side CAM array 12b.

Many communications applications require a CAM device to be able to handle the occurrence of multiple matches between an applied search word and entries within multiple CAM arrays in the CAM device. This is usually handled by having differential priorities assigned to the various CAM arrays and entries so that the address of a single matching entry or the address of a highest priority matching entry is output based on physical priority. Operations to identify a highest priority matching entry from a plurality of matching entries will now be described in greater detail.

Figure 4D:
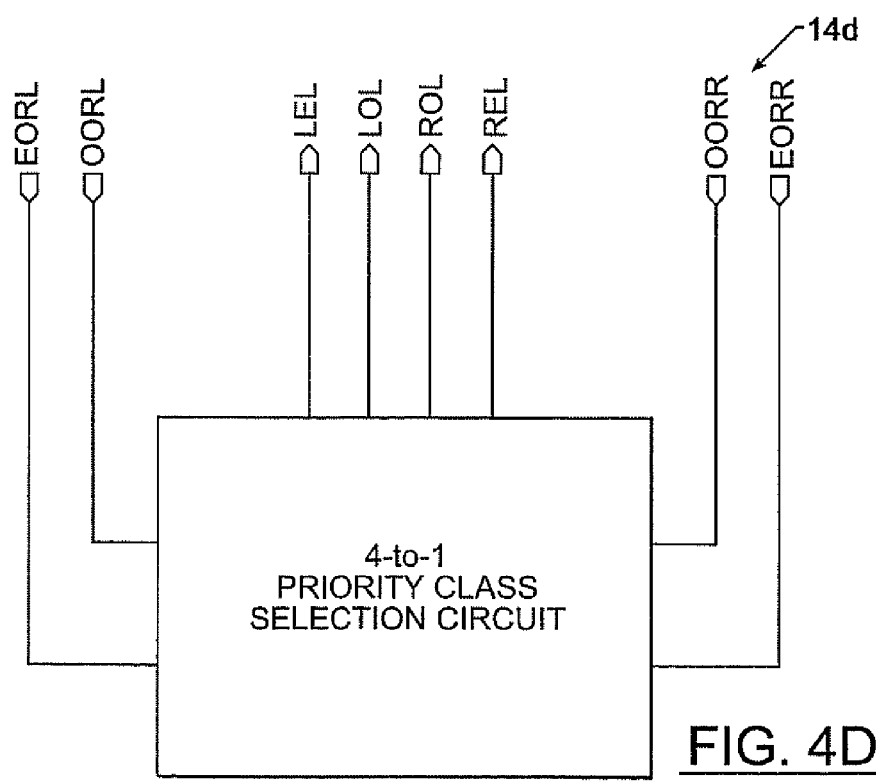

These operations to identify a highest priority matching entry may include using a 4-to-1 priority class selection circuit 14d to identify a highest priority class having at least one matching entry from four different priority classes. This priority class selection circuit 14d is illustrated by FIG. 4D. This priority class selection circuit 14d is configured to simultaneously maintain all of the signal lines LEL ("Left Even Latch"), LOL ("Left Odd Latch"), ROL ("Right Odd Latch") and REL ("Right Even Latch") low when all four signal lines EORL, OORL, OORR and EORR are at their respective precharged high levels. However, if one or more of the four signal lines EORL, OORL, OORR and EORR is pulled low, then one and only one of the signal lines LEL, LOL, ROL and REL will be driven high according to the priority class of a highest priority match associated with the left side CAM array 12a and the right side CAM array 12b. Accordingly, the priority class selection circuit 14d is configured to weight the four signal lines EORL, OORL, OORR and EORR differently and to ignore all lower priority indications of matching entries whenever at least one higher priority match is present.

For purposes of discussion herein, the priority class selection circuit 14d is configured to weight signal line EORL relatively higher than signal line OORL and signal line EORR relatively higher than signal line OORR. This relative even versus odd weighting scheme is arbitrary. This weighting scheme translates to all even rows 0, 2, 4, . . . , 510 in the left side CAM array 12a being of higher priority than any odd rows 1, 3, 5, . . . , 511 in the left side CAM array 12a and all even rows 0, 2, 4, . . . , 510 in the right side CAM array 12b being of higher priority than any odd rows 1, 3, 5, 511 in the right side CAM array 12b. If priority 0 is to be arbitrarily assigned as the highest priority and priority 511 the lowest priority, then the top row (row 0) may retain the highest priority entry, priority 0, and the next row (row 1) may retain an entry having a priority of 256. In a similar fashion, the next row (row 2) may have an entry with priority 1 and the following row (row 3) may have an entry with priority 257.

The priority class selection circuit 14d may also be configured (e.g., "hard-wired") to treat the left side CAM array 12a as having higher priority under all circumstances relative to the right side CAM array 12b or vice versa. That is, both even and odd entries of the left side CAM array 12a may be treated as having higher priority than the entries in the right side CAM array 12b. This hard-wired weighting scheme may also be arbitrary. Once the weighting scheme has been established, all even and odd rows within a respective pair of CAM arrays will be treated as being in one of four different respective priority classes (even left, odd left, even right and odd right). Moreover, within a given priority class, different rows may ultimately be treated as having different priority based on physical location. For example, priority may be based on row number, with the first even row (row 0) having higher priority (priority 0) than the second even row (row 2) and so on and so forth for the remaining even rows, with the last even row (row 510) having the lowest priority within a respective priority class. Similarly, the odd rows may have priorities 256 (row 1) through 511 (row 511). As explained hereinbelow, the assessment of which row(s) having a matching entry (i.e., hit) within a respective priority class has the highest priority relative to other rows having matching entries within the same priority class is preferably made by a global priority encoder that receives match information one-at-a-time from a selected CAM array within a corresponding left-side tier or right-side tier of CAM arrays.

Based on the weighting scheme described above, (i) signal line LEL (corresponding to the highest priority class) will be driven high if and only if signal line EORL goes low, (ii) signal line LOL (corresponding to the second highest priority class) will be driven high only when signal line OORL goes low and signal line EORL is high, (iii) signal line REL (corresponding to the third highest priority class) will be driven high when signal line EORR goes low and signal lines EORL and OORL are both high, and (iv) signal line ROL (corresponding to the lowest priority class) will be driven high when signal line OORR goes low and signal lines EORL, OORL, and EORR are all high. Stated alternatively, condition (i) will occur whenever there is a matching entry in any physically even row within the left side CAM array 12*a*. Condition (ii) will occur whenever there is a matching entry in any physically odd row within the left side CAM array 12*a* but no even matching entries therein. Condition (iii) will occur whenever there is a matching entry in any physically even row within the right side CAM array 12*b*, but no matching entries within the left side CAM array 12*a*. Finally, condition (iv) will occur whenever there is a matching entry in any physically odd row within the right side CAM array 12*b*, but no even matching entries in the right side CAM array 12*b* or even or odd matching entries in the left side CAM array 12*a*.

The choice of which locations to write the various data entries into a CAM device is typically made in accordance with the above-described weighting scheme. Thus, if the CAM device 10 includes only a single CAM array pair having a capacity of 1024 words, then the 256 highest priority words should be written into the even rows within the left side CAM array 12*a* and the 256 next highest priority words should be written into the odd rows within the left side CAM array 12*a*. The remaining 512 entries should be written into the right side CAM array 12*b* in a similar manner. For CAM devices 10 having a greater number of CAM array pairs, the relative priority between CAM array pairs can be used to control the sequence by which CAM arrays are loaded.

As will be understood by those skilled in the art, this relative priority between CAM array pairs may be hard wired or may follow a soft priority scheme that is programmable prior to writing data entries into the CAM device 10. Likewise, the relative priority between a left side CAM array 12*a* and a right side CAM array 12*b* in a respective CAM array pair may also be determined based on a soft priority scheme that is programmable. If a soft priority scheme applies between left and right CAM arrays of a respective CAM array pair, then the priority class selection circuit 14*d* of FIG. 4D may include programmable circuitry (e.g., single-bit register) that can be loaded with the relative left versus right soft priority. In this manner, the priority of the pair of signal lines EORL and OORL relative to EORR and OORR in FIG. 4D can be programmed to weigh EORL and OORL more or less heavily than EORR and OORR. The relative priority between a left side CAM array 12*a* and a right side CAM array 12*b* in a respective pair may also be established independently in a manner that does not result in the CAM arrays of a respective pair having consecutive priorities relative to other CAM arrays in a CAM device 10. Thus, in a CAM device 10 comprising only two pairs or CAM arrays, the relative priority between a left side and right side CAM array in a first pair may be 1 and 3 and the relative priority between a left side and right side CAM array in a second pair may be 2 and 4.

Nonetheless, for purposes of discussion herein, each CAM array pair will be treated as having a single "pair" priority (programmable or hard-wired) relative to other CAM array pairs. The priority class selection circuit 14*d* of FIG. 4D will also be treated as generating a signal at an output (shown as HIT) whenever one or more matching entries are detected within a respective CAM array pair. The advantage of using this output signal HIT in identifying a highest priority CAM array pair having at least one match will be described more fully hereinbelow. In the event the relative priorities of the left and right-side CAM arrays are independently programmable in a manner that does not require that they have consecutive priorities relative to all other CAM arrays in a CAM device 10, then the priority class selection circuit 14*d* may need to generate an output signal HIT and an additional signal (left/right "L/R") that identifies whether the left or right-side array had the higher priority match. This additional signal can be used to reconcile which CAM array within a tier of CAM arrays has a highest priority match.

This priority weighting scheme also assumes and takes advantage of the fact that only the highest priority match is of interest. It may be of interest that more than one match was detected, but only the address of the row retaining the highest priority matching entry is required to be provided as an output from the CAM device 10. Thus, within a respective CAM array, the existence of any even row match may eliminate the need to consider any odd row matches. Similarly, within a respective CAM array pair, the existence of any match in a left side CAM array 12*a* may eliminate the need to consider any matches in the right side CAM array 12*b* of the same pair.

Referring again to FIGS. 4A and 4B, because the priority class selection circuit 14*d* will only drive one of the signal lines LEL, LOL, REL and ROL high upon detection of at least one match by the left input stage 14*a* or right input stage 14*b*, only one set of match condition lines: {MATCH0L, MATCH2L, . . . , MATCH510L}, {MATCH1L, MATCH3L, . . . , MATCH511L}, {MATCH0R, MATCH2R, . . . , MATCH510R} or {MATCH1R, MATCH3R, . . . , MATCH511R} will communicate information to the final stage 14*e* of the bidirectional interface illustrated by FIG. 5. As will be explained more fully hereinbelow, NMOS transistors (N12L, N13L) and (N16L, N17L) and other NMOS transistor pairs associated with the even match condition lines in a left side CAM array 12*a* operate as respective first half stages of single-bit shift registers. Each first half stage performs a latching function that enables the states of the even match condition lines to be "remembered" while a highest priority CAM array pair having at least one match is identified and typically also while a subsequent compare operation is being performed in a pipelined manner in the left side CAM array 12a. This latching function is performed in-sync with a rising edge of a signal on signal line LEL. Similarly, NMOS transistors (N14L, N15L) and (N18L, N19L) and other NMOS transistor pairs associated with the odd match condition lines in a left side CAM array 12a perform a latching function that enables the states of the odd match condition lines to be "remembered". The corresponding NMOS transistor pairs associated with the right side CAM array perform a similar function.

A number of examples will now be provided to more fully explain the operation of the priority class detector illustrated by FIGS. 4A-4D and 5. In these examples, the priority class selection circuit 14d of FIG. 4D will be treated as being hard wired so that the left side CAM array 12a always has a higher priority relative to the right side CAM array 12b. The CAM arrays within each pair are also treated as having consecutive priorities that cannot be modified using a soft priority technique. Nonetheless, a soft priority technique may apply that allows the relative priorities of each CAM array pair to be modified.

As a first example, if only one matching entry is present in a physically even row 0 of the left side CAM array 12a and no other even or odd matching entries are present in the respective CAM array pair, then the first match condition line MATCH0L will be driven high and NMOS transistor N12L at the rightmost end of the first match condition line MATCH0L will turn on. NMOS transistor N8L will also be turned on to thereby pull down signal line EORL from a precharged high level. NMOS transistors N14L, N16L and N18L at the ends of match condition lines MLINE1L, MATCH2L and MATCH3L will remain off.

In response to the high-to-low transition on signal line EORL, the priority class selection circuit 14d of FIG. 4D will drive signal line LEL to an active high level. Once signal line LEL transitions from a normally low level to an active high level, NMOS transistor N13L will turn on to thereby effectively "latch" the state of the first match condition line MATCH0L. In particular, the combination of both NMOS transistors N12L and N13L being turned on will result in signal line ROW0-1 being pulled low from a precharged high level. In this manner, NMOS transistors N12L and N13L collectively function as a first half stage of a shift register with signal line LEL acting as a clock input. Once this latching event occurs and the match information associated with the first match condition line MATCH0L has been stored, the first match condition line MATCH0L can be pulled low in preparation for a subsequent compare operation with a new search word.

As illustrated by FIG. 5, the precharged high level on signal line ROW0-1 is established by driving signal line SR1 high-to-low to thereby turn on PMOS pull-up transistor P8 during a first half of an evaluate cycle that occurs during a search operation. Signal line ROW0-1 spans left-to-right across the final stage 14e of FIG. 5 and terminates at the left side of the right input stage 14b of FIG. 4B. The latching operation performed by NMOS transistors N12L and N13L is also advantageous because it enables the state of the first match condition line MATCH0L to be "remembered" while parallel operations are performed to determine whether the corresponding CAM array pair is the highest priority CAM array pair having at least one matching entry. These operations to determine which CAM array pair is the highest priority pair (or contains a left-side or right-side CAM array that is highest priority) is typically made by other "pair" priority identification circuitry (not shown) during the evaluate cycle. This pair priority identification circuitry may be responsive to the HIT outputs of each of the priority class selection circuits 14d illustrated by FIG. 4D. This pair priority identification circuitry may be of conventional design and need not be described further herein.

As another example, if matching entries are present in odd row 1 and even row 2 of the left side CAM array 12a and no other even or odd matching entries are present in the respective CAM array pair, then match condition lines MATCH1L and MATCH2L will both be driven high and NMOS transistors N14L and N16L at the rightmost ends of match condition lines MATCH1L and MATCH2L will turn on. NMOS transistors N9L and N10L will also be turned on to thereby pull down signal lines EORL and OORL from their precharged high levels. In response to the high-to-low transitions on signal lines EORL and OORL, the priority class selection circuit 14d of FIG. 4D will again drive only signal line LEL to an active high level, while all other signal lines LOL, REL and ROL will remain low. Once signal line LEL transitions to an active high level, NMOS transistor N17L will turn on. The combination of both NMOS transistors N16L and N17L being on will latch the state of the match condition line MATCH2L and thereby cause signal line ROW2-3 to be pulled low from a precharged high level. As illustrated by FIG. 5, this precharged high level is established by driving signal line SR1 high-to-low to thereby turn on PMOS pull-up transistor P9 during the first half of the evaluate cycle. Signal line ROW2-3 spans left-to-right across the final stage 14e of FIG. 5 and terminates at the left side of the left input stage 14b of FIG. 4B.

As a final example, if matching entries are present in odd rows 1 and 3 of the right side CAM array 12b and no other even or odd matching entries are present in the respective CAM array pair, then match condition lines MATCH1R and MATCH3R will both be driven high and NMOS transistors N14R and N18R at the leftmost ends of match condition lines MATCH1R and MATCH3R will turn on. NMOS transistors N9R and N11R will also be turned on to thereby jointly pull down signal line OORR from its precharged high level. In response to the high-to-low transition on signal line OORR, the priority class selection circuit 14d of FIG. 4D will drive only signal line ROL to an active high level, while all other signal lines LEL, LOL and REL will remain low. Once signal line ROL transitions to an active high level, NMOS transistors N15R and N19R will turn on. The combination of NMOS transistors N14R and N15R being on will latch the state of match condition line MATCH1R and cause signal line ROW0-1 to be pulled low from a precharged high level. Similarly, the combination of NMOS transistors N18R and N19R being on will latch the state of the match condition line MATCH3R and cause signal line ROW2-3 to be pulled low from a precharged high level.

These above examples illustrate how a single matching entry or multiple matching entries within a highest priority class of rows in a respective CAM array pair can be identified by evaluating the state of the 256 signal lines ROW0-1, ROW2-3, ROW4-5 (not shown), . . . , ROW510-511 (not shown) that span left-to-right across the final stage 14e of the bidirectional interface circuit 14. Based on these examples, it should be readily apparent that if match lines MLINE5L, MLINE24L, MLINE54L, MLINE17R and MLINE506R remain high at the end of a compare operation and the even priority class in the left side CAM array 12a has the highest priority relative to all other classes within the CAM array pair, then only signal lines ROW24-25 and ROW54-55 (not shown) that span the final stage 14e will be pulled low from a precharged high level during an evaluate cycle. Nonetheless, these examples and the circuits described thus far may not provide conclusive information as to whether the priority of the matching entry at row 24 of the left side CAM array 12a is higher or lower than the priority of the matching entry at row 54 of the left side CAM array 12a. In other words, conclusive information as to which of many matching entries within a highest priority class represents an absolute highest priority match is typically not provided by the priority class detector. Instead, the global priority encoder within the centrally located control circuit 16 preferably makes this assessment once a highest priority CAM array pair having at least one match has been identified.

As further illustrated by FIG. 5, the state of the signal lines ROW0-1, ROW2-3, . . . , ROW510-511 that span the final stage 14e of the bidirectional interface circuit 14 can be detected using a plurality of devices that operate essentially as final latch stages. For example, the inverter I7 and transmission gate TG1 illustrated by FIG. 5 operate as a final latch stage that passes and holds an inverse of the state of signal line ROW0-1 at the input of a NAND gate ND9. The control inputs of the latch are responsive to a pair of differential signals SR2 and SR2B. Signal SR2 is an active high signal that transitions low-to-high during a second half of the evaluate cycle. The control inputs of the latch are illustrated by the true and complementary inputs of the transmission gate TG1. Based on this illustrated configuration of the latch associated with signal line ROW0-1, the high-to-low transition of signal line ROW0-1 can be detected in-sync with a leading edge of signal SR2. In particular, the inverter I7 and transmission gate TG1 will latch a low level signal on signal line ROW0-1 as a high level signal that is input to the NAND gate ND9. Once this low level signal on signal line ROW0-1 is passed as a high level signal to an input of the NAND gate ND9, the transmission gate TG1 can be turned off to latch the high level signal at the input of the NAND gate ND9 and enable the signal line ROW0-1 to be precharged to a high level again while a follow up compare operation is being performed in a pipelined fashion. The inverter I8 and transmission gate TG2 associated with the signal line ROW2-3 operate in a similar manner to latch a low level signal on signal line ROW2-3 as a high level signal that is input to the NAND gate ND10.

As illustrated, NAND gates ND9 and ND10 (and the remaining NAND gates (not shown) associated with signal lines ROW4-5, . . . , ROW510-511) are responsive to an enable signal, shown as PEN. This enable signal PEN is positive at a next evaluate cycle if the pair priority identification circuitry (not shown) has identified the CAM array pair as the highest priority CAM array pair having at least one matching entry within a respective tier (or row, or possibly all the tiers of the CAM device 10). During this next evaluate cycle, a new search operation using a new search word may be occurring in the CAM array pairs. This enable signal PEN, which essentially operates as a clock signal to final stages of a plurality of latches, is necessary to prevent multiple CAM arrays within a common tier of CAM array pairs from communicating match information at the same time and on the same signal lines to a single priority encoder within the control circuit 16. In other words, the enable signal PEN does not transition high at least until the highest priority CAM array pair having at least one match in a respective tier has been identified. Nonetheless, the enable signal PEN may transition high before the highest priority CAM array pair having match in a row or across all rows has been identified.

Assuming, for sake of discussion, that the enable signal PEN for the illustrated CAM array pair does transition low-to-high, the boolean AND operation performed by NAND gate ND9 and inverter I13 and/or the AND operation performed by the NAND gate ND10 and inverter I14 (and so on for the rest of the 254 remaining signal lines ROW 4-5, . . . , ROW510-511) will translate any low signals on signal lines ROW0-1, . . . , ROW510-511 as active high signals to the inputs of NMOS pull-down transistors N20, N21, and the remaining NMOS pull-down transistors (not shown) for the remaining 254 rows. As will be understood by those skilled in the art, an active high signal at the input of the NMOS pull-down transistor N20 will cause the first global word line GWL0 to be pulled low. Here, the global word lines GWL0-GWL255 preferably span a respective left side or right side tier of CAM array pairs within the CAM device 10 and are electrically connected to the control circuit 16. These global word lines GWL0-GWL255 are normally precharged high.

As described herein, the global word lines are preferably configured as bidirectional signal lines that pass 256 outgoing active low global word line signals from the global word line decoder within the control circuit 16 to each of the bidirectional interface circuits 14 associated with a respective left side or right side tier. The global word lines also pass 256 incoming active low match signals from a selected bidirectional interface circuit 14 to a priority encoder within the control circuit 16. In this manner, the global word lines GWL0-GWL255 operate as global word/match lines and the interface circuits 14 operate to facilitate bidirectional data transfer. Thus, according to a preferred aspect of the illustrated CAM device 10, the global word lines operate not only as global word lines in a conventional sense during CAM reading and writing operations, but also operate in a bidirectional capacity as data lines that convey match information during CAM search operations. This bidirectional capability of the word lines may also be applied to other memory devices besides CAM devices and to other forms of data besides match information. In the event bidirectional global word lines are not provided, separate global word line traces and global match line traces may be provided using the same or different levels of metallization. Thus, although preferred, it is not absolutely necessary that the global word lines be operated as bidirectional global word/match lines in the manner illustrated and described herein.

The discussion of FIGS. 2-5 herein also reveals how priority class detection can be used advantageously to reduce the pitch between signal lines operating as global match lines. For example, although each left side CAM array 12a and right side CAM array 12b includes 512 match lines MLINE0-MLINE511, the priority class detector illustrated by FIGS. 4A-4D and 5 facilitates the use of only 256 global word lines GWL0-GWL255 to communicate all match information from a selected CAM array pair to a global priority encoder. Thus, not only is it not necessary to provide a separate priority encoder between each CAM array within a pair, a reduced number of global word lines can be advantageously utilized to support both word line and match line signals. These aspects of the illustrated CAM device 10 result in significant savings in chip area and increased yield resulting from lower density wiring and interconnects.

Moreover, using circuitry similar to that shown by the inputs stages 14a and 14b of FIGS. 4A-4B and by using a 8-to-1 selection circuit similar to the 4-to-1 selection circuit shown by FIG. 4D, the priority class detector may also be used to facilitate the use of only 128 bidirectional global word/match lines. Here, rather than assigning every physically even and every physically odd row within a CAM array to an "even" or "odd" priority class, every fourth row can be assigned to a respective one of four priority classes. Finally, as illustrated by the left-side input stage 14a' of FIG. 6, which is similar to the input stage 14a of FIG. 4A, every other pair of rows within a CAM array may be assigned to a respective even or odd priority class. Other arrangements of rows may also be used with a preferred priority class detector in accordance with embodiments of the present invention.

Referring again to FIG. 5, the preferred bidirectional interface circuit 14 also includes a local word line decoder. With respect to the first global word line GWL0, the local word line decoder includes inverters I1, I3-I4 and I9-I10 and NAND gates ND1-ND2 and ND5-ND6. With respect to the second global word line GWL1, the local word line decoder includes inverters I2, I5-I6 and I11-I12 and NAND gates ND3-ND4 and ND7-ND8. Identical devices (not shown) are also provided to decode global word lines GWL2-GWL255. Based on this construction of the local word line decoder illustrated by FIG. 5, an active high LEW signal will enable an active low global word line signal on the first global word line GWL0 to be passed as an active high local word line signal on the first local word line LWL0L associated with the left side CAM array 12a. Similarly, an active high LOW signal will enable an active low global word line signal on the first global word line GWL0 to be passed as an active high local word line signal on the second local word line LWL1L associated with the left side CAM array 12a. An active high REW signal will enable an active low global word line signal on the first global word line GWL0 to be passed as an active high local word line signal on the first local word line LWL0R associated with the right side CAM array 12b. And, an active high ROW signal will enable an active low global word line signal on the first global word line GWL0 to be passed as an active high local word line signal on the second local word line LWL1R associated with the right side CAM array 12b. The additional local word line decoding circuitry (shown for GWL1 but not GWL2-GWL255) works in a similar manner to selectively provide active high local word lines signals to the local word lines associated with the left side CAM array 12a or right side CAM array 12b.

The global priority encoder within each control circuit 16 is a circuit that selects the highest priority matching entry from one or more matching entries that have been identified in a highest priority CAM array pair having at least one match. This highest priority CAM array pair may be the highest priority CAM array pair within a respective tier, a respective row, or across all rows. Thus, if three matches are identified in a highest priority class of a highest priority CAM array pair, then three of the bidirectional global word lines will have been discharged low from their precharged high levels. The corresponding global priority encoder evaluates the three global word lines that have been discharged and selects the highest priority match from the three. This selection operation may be performed in a conventional manner based on physical location.

Global priority encoders that select a highest priority match are well known to those skilled in the art, but typically require a large number of transistors with look-ahead circuitry if they are to be fast. The large number of transistors require a large area for their physical layout. Yet, even more area is required to encode the highest priority match into the address of the highest priority match, which is output by the CAM device 10. Because each priority encoder typically requires a large amount of silicon area, there is a very large benefit that can be achieved by reducing the required number of priority encoders from one for every CAM array pair (see, e.g., FIG. 1) to only one for every row of CAM array pairs as described herein (see, e.g., FIG. 2A). The inputs to this single priority encoder may be multiplexed to receive signals from a left tier of global word/match lines or a right tier of global word/match lines, once a decision has been made by the pair priority identification circuitry as to whether a CAM array in a left tier or right tier of a respective row has a highest priority match.

Using the techniques described herein, it also becomes relatively easy to determine if there is more than one match during a respective lookup cycle. As the previously described circuitry selects only the highest priority match and encodes the address of this match, other very simple circuitry (not shown) can be used to determine the existence of more than one match. If there is more than one match detected during a given lookup cycle, then at least one of the following three conditions must be true: (i) there are (at least) two arrays having matches, (ii) there are (at least) two priority classes in one array having matches, or (iii) there are (at least) two rows of the same priority class in the same array having matches. Each of these three conditions is relatively easy to determine. The previously described global priority encoders can be modified to not only select the highest priority array to have a match but also to determine that two or more arrays have matches. The previously described priority class selection circuit 14d can be modified to detect that at least two of its inputs from one array ((EORL and OORL) or (EORR and OORR)) are discharged to indicate more than one class of inputs having a match. Finally, each global priority encoder can be modified to detect the existence of two (or more) matches from the same class within the same CAM array. These modifications can be utilized to provide signals that are ORed to provide "multiple hit" information.

As previously described, it is necessary to at least determine the highest priority array having a match within a respective tier before allowing match information to be placed onto the global word lines associated with the respective tier. This is because multiple CAM array pairs within a tier preferably share the same global word lines and these global word lines cannot be accessed simultaneously with match information from multiple CAM array pairs without mixing the match information and precluding the priority encoder from identifying the highest priority matching entry. Thus, with respect to FIG. 2A, it is necessary to find the highest priority array having a match from among arrays within a given tier (e.g., $CAM_{00}$-$CAM_{03}$) before any of these arrays place their match information on the global word lines. The same is true for all other tiers of CAM arrays. It is typically faster to determine the highest priority array having a match from within a tier of arrays than it is to determine the highest priority array having a match from within all arrays of all rows. Thus, once the highest priority array from within a tier has been identified, that array can discharge the respective global word lines connected to it. At the same time, the highest priority arrays from all other tiers can discharge their respective global word lines. By the time the respective global word lines have been discharged in each tier, the pair priority identification circuitry (not shown) will have identified the tier having the highest priority CAM array having at least one match from all the CAM arrays in the device. The match information from that tier is then encoded by its respective global priority encoder to provide the address of the highest priority entry having a match.

Sending the match information from a local bidirectional interface circuit $BIC_{xx}$ (element 14 in FIG. 2A) to a global priority encoder before determining the highest priority array in the entire circuit to have a match decreases the time match data must be "remembered" by each bidirectional interface circuit before outputting that data on the global word lines. This decrease in time allows either higher frequency operation or fewer bits of shift register delay in every bidirectional interface circuit $BIC_{xx}$.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A content addressable memory (CAM) device, comprising:
   a priority encoder;
   a global word line decoder;
   a plurality of global word lines electrically coupled to said global word line decoder and said priority encoder;
   a plurality of CAM arrays; and
   a bidirectional interface circuit configured to receive word line signals from said plurality of global word lines and pass match information from a selected one of said plurality of CAM arrays to said plurality of global word lines in response to detecting a match in the selected one of the plurality of CAM arrays.

2. The CAM device of claim 1, wherein said bidirectional interface circuit comprises a priority class detector configured to pass match information from a selected priority class in the selected one of the plurality of CAM arrays, in response to detecting a match in the selected priority class during a search operation.

3. The CAM device of claim 2, wherein said bidirectional interface circuit comprises a local word line decoder.

4. The CAM device of claim 1, wherein said bidirectional interface circuit comprises a local word line decoder.

5. A content addressable memory (CAM) device, comprising:
   a priority encoder;
   a global word line decoder;
   a plurality of global word lines electrically coupled to said global word line decoder and said priority encoder;
   a plurality of CAM arrays; and
   a bidirectional interface circuit configured to receive word line signals from said plurality of global word lines during read and/or write operations and pass match information from said plurality of CAM arrays to said plurality of global word lines during search operations.

6. The CAM device of claim 5, wherein said bidirectional interface circuit comprises a priority class detector configured to pass match information from a selected priority class in a selected one of said plurality of CAM arrays to said plurality of global word lines, in response to detecting a match in the selected priority class during a search operation.

7. A content addressable memory (CAM) device, comprising:
   a priority encoder;
   a global word line decoder;
   a tier of CAM arrays; and
   a plurality of dual-purpose global match/word lines electrically coupled to said tier of CAM arrays, said priority encoder and said global word line decoder, said plurality of dual-purpose global match/word lines configured to support communication of word line signals between said tier of CAM arrays and said global word line decoder during read and write operations and also configured to support communication of match line signals between said tier of CAM arrays and said priority encoder during search operations.

* * * * *